United States Patent [19]

Kusunoki

[11] Patent Number: 5,963,089
[45] Date of Patent: Oct. 5, 1999

[54] SEMICONDUCTOR AMPLIFYING APPARATUS AND COMMUNICATION TERMINAL APPARATUS

[75] Inventor: Shigeo Kusunoki, Kanagawa, Japan

[73] Assignee: Sony Corporation, Japan

[21] Appl. No.: 08/927,279

[22] Filed: Sep. 11, 1997

[30] Foreign Application Priority Data

Dec. 9, 1996 [JP] Japan ................................. 8-265203

[51] Int. Cl.[6] ................................. H03F 1/26; H03F 3/04
[52] U.S. Cl. ........................... 330/149; 330/297; 330/302
[58] Field of Search ................................. 330/149, 277, 330/286, 306, 302; 375/297

[56] References Cited

U.S. PATENT DOCUMENTS 5,710,523  1/1998  Kobayashi ........................ 330/300 X
5,722,063  2/1998  Peterzell et al. ..................... 455/287

Primary Examiner—Robert Pascal
Assistant Examiner—Patricia Nguyen
Attorney, Agent, or Firm—Radar, Fishman & Grauer; Ronald P. Kananen

[57] ABSTRACT

A semiconductor amplifying apparatus and a communication terminal apparatus to satisfy a standard value for adjacent channel power and amplify the power at a high efficiency. The value of an impedance viewed from an input terminal side of an impedance circuit network connected to an input terminal of a transistor is set at a value which causes a characteristic curve for a mutual modulation distortion component included in output power of the transistor to form, in the middle thereof, a curve section in which an inclination angle of a tangential line to this characteristic curve once becomes smaller, or a curve section which protrudes downwardly.

24 Claims, 24 Drawing Sheets

SEMICONDUCTOR AMPLIFYING APPARATUS AND COMMUNICATION TERMINAL APPARATUS

BACKGROUND OF THE INVENTION

1. Field of the Invention

The present invention relates to a semiconductor amplifying apparatus and a communication terminal apparatus which can be applied to, for example, portable telephones of a quasi-micro wave band and semiconductor amplifying apparatuses for amplifying the power of the quasi-micro waves.

2. Description of the Related Art

At present, the operation of land mobile communication systems, represented by the PHS (Personal Handphone System) and a transmission scheme, referred to as a "PDC" (Personal Digital Cellular) scheme, using a quasi-micro wave band (0.8 to 2 GHz), has been inaugurated in automobile telephone and portable telephone services in order to support an increasing number of subscribers. Since communication terminal apparatuses for use in such a mobile communication systems particularly attach importance to their portability, they are essentially small and battery-driven. Particularly, power amplifying apparatuses for transmission require a large amount of current consumption or power consumption, a reduction in current consumption is an important problem.

The above-mentioned systems such as PHS, PDC, and so on, adopt modulation schemes which are modifications to the quadrature phase shift keying (QPSK) modulation such as $\pi/4$ shift differential quadrature phase shift keying (QPSK). Power amplifying apparatuses for use in these mobile communication systems for transmission are required to have linear or quasi-linear operation characteristics.

For reducing the generation of distortion as much as possible in power amplifying apparatuses, an operation point of an A-grade or an AB-grade near an A-grade may be selected. The selection of this operation point causes a power addition efficiency to decrease due to a large amount of current consumption.

On the other hand, there is an amplifier which sets its operation point at an AB-grade near a B-grade to generate a predetermined output and corrects distortion generated in this event by a special means. A predistortion amplifier or the like may be taken as an example. However, since this type of amplifier has a complicated configuration, implementation of the amplifier in a one-chip semiconductor amplifier device is practically difficult. Distortion correction techniques as mentioned above, in turn, are extremely effective in realizing a battery-driven highly efficient linear amplifier, extensive research and development on such techniques are still currently in progress.

A technique for correcting distortion is described, for example, in an article entitled "Analysis on Phase Characteristics of GaAs FET Power Amplifier for Digital Portable Telephone", Transactions of the Institute of Electronics, Information, and Communication Engineers C-1, VOL. J76-C-1, No.11, pp.414–421 (November 1993). This article shows that a phase deviation of a fundamental wave in output power with respect to increased input power varies depending on an impedance of a matching circuit connected to an input terminal or an output terminal of a field effect transistor (hereinafter referred to as an "FET" (Field Effect Transistor)). This article also shows that distortion can be reduced at the same output level by making the phase deviation smaller.

An example of an actual design for a semiconductor amplifying apparatus employing similar techniques is described in an article entitled "Design of Linear Power Amplifiers for Digital Cordless", 1994 Spring National Meeting of the Institute of Electronics, Information, and Communication Engineers, C-106. According to this design example described in the article, a modulated signal of a PHS system can be outputted with distortion reduced to as low as 22.7 dBm by reducing a phase deviation of a fundamental wave.

It should be noted that a semiconductor amplifying apparatus is only practically required to have adjacent channel power (hereinafter referred to as "ACP") satisfying a standard value of −55 dBc or less irrespective of the amount of phase deviation of a fundamental wave. Thus, the impedance of a matching circuit connected to a drain terminal of a GaAs junction FET (hereinafter referred to "GaAs JFET") is fixed, while the impedance of a matching circuit connected to a gate terminal of the same is varied to apply input power to the gate terminal. Under these conditions, measurements are made to the output power which provides the full standard value (hereinafter referred to as the "effective output") and a phase deviation amount of a fundamental wave.

As illustrated in a Smith chart of FIG. 30, the measurements result in characteristic curves 1, 2, 3 and 4 (represented by solid lines in the figure) for the effective outputs $P_0$ and characteristic curves 5, 6 and 7 (represented by broken lines in the figure) for phase deviation amounts of the phase $\phi$ of the fundamental wave on a Smith chart.

The characteristic curves 1, 2, 3 and 4 represent $P_0$=23.3 dBm, $P_0$=23.4 dBm, $P_0$=23.5 dBm, and $P_0$=24.0 dBm, respectively, while the characteristic curves 5, 6 and 7 represent $\phi$=5°, $\phi$=4°, and $\phi$=3° respectively.

A current flowing into the GaAs JFET, which is determined by voltages applied to the drain terminal and the gate terminal, remains at 120 mA irrespective of variations in impedances of the matching circuits connected to the respective terminals. The relationship between the phase deviation of the fundamental wave and the effective output can be understood from FIG. 30.

However, FIG. 30 reveals that no causal relation is established between the phase deviation amount of the fundamental wave and the effective output. More specifically, a central position of distribution of contour-like characteristic curves 1 to 4 for the effective output $P_0$ is far spaced away from a central position of distribution of contour-like characteristic curves 5 to 7 for the phase deviation amounts of the phase $\phi$ of the fundamental wave.

This implies a problem that an amplifying apparatus exhibiting a full efficiency is not always realized, even if the phase deviation amount of the fundamental wave is reduced. In other words, a matching circuit has been connected which has an impedance for setting the phase deviation amount of the fundamental wave to a minimum.

SUMMARY OF THE INVENTION

The present invention has been developed in view of the discussions and features mentioned above, and relates to a semiconductor amplifying apparatus capable of amplifying power at an efficiency higher than conventional amplifying apparatuses with the adjacent channel power satisfying a standard value, and a communication terminal apparatus using this semiconductor amplifying apparatus.

To address and presumably solve the aforementioned and other problems, the present invention provides an impedance circuit network connected to an input terminal or an output terminal of a transistor for forming, in the middle of a characteristic curve representing a mutual modulation distortion component included in an output power of the transistor with respect to an input power due to an input signal applied to the transistor, a curve section in which an inclination angle of a tangential line to the characteristic curve once becomes smaller, or a curve section which protrudes downwardly.

The value of the impedance viewed from the input terminal of the impedance circuit network connected to the input terminal of the transistor is set at a value which causes the characteristic curve representing the mutual modulation distortion component included in the output power of the transistor to form, in the middle thereof, a curve section in which an inclination angle of a tangential line to the characteristic curve once becomes smaller, or a curve section which protrudes downwardly. Thereby, it is possible to satisfy the standard value for the adjacent channel power and to amplify the power at an efficiency much higher than before.

Also, in the present invention, in a communication terminal apparatus having a semiconductor amplifier unit in which an input signal is applied to a transistor for amplification so as to make communications through an output signal generated by amplifying the input signal by the semiconductor amplifier unit, the semiconductor amplifier unit comprises an impedance circuit network connected to an input terminal or an output terminal of a transistor for forming, in the middle of a characteristic curve representing a mutual modulation distortion component included in an output power of the transistor with respect to an input power due to an input signal applied to the transistor, a curve section in which an inclination angle of a tangential line to the characteristic curve once becomes smaller, or a curve section which protrudes downwardly.

DESCRIPTION OF THE PREFERRED EMBODIMENTS OF THE INVENTION

One embodiment of the present invention will hereinafter be described in detail with reference to the accompanying drawings.

(1) Configuration of the Embodiment of the Invention (1-1) Entire Configuration

Figure 1:
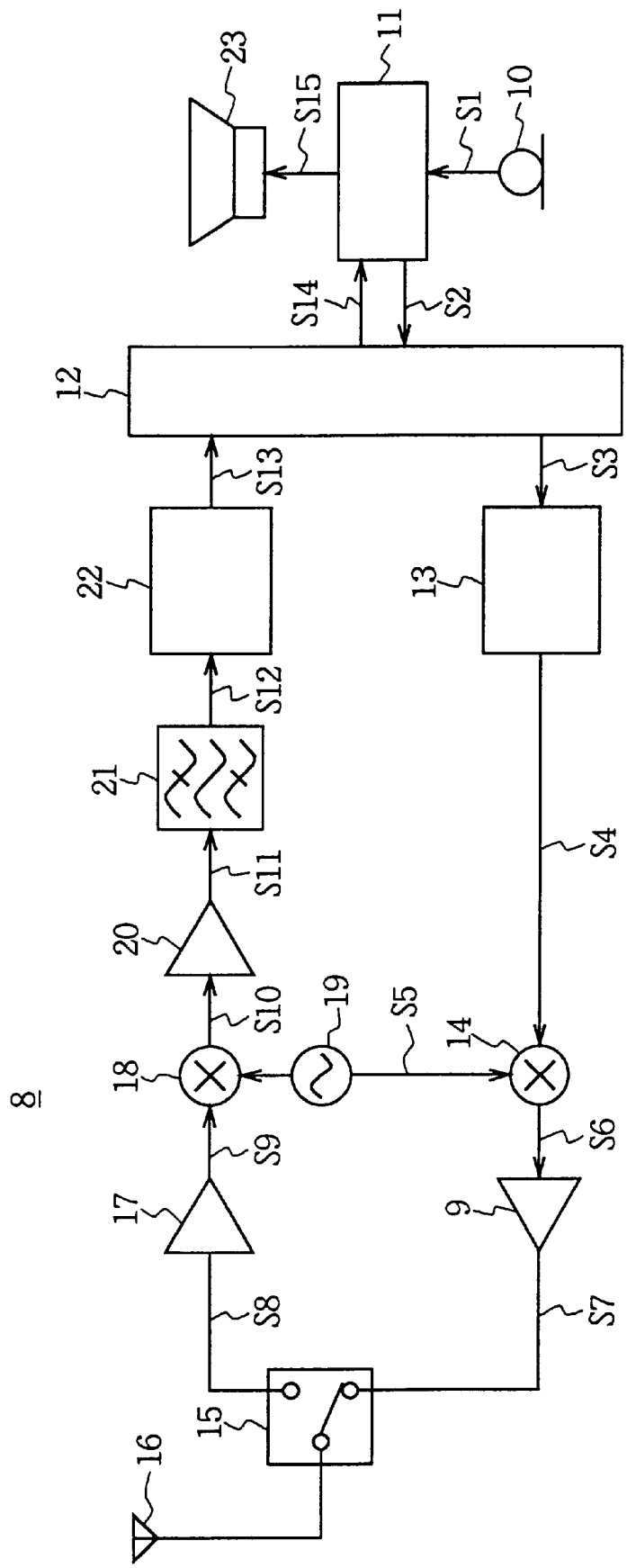
FIG. 1 is a block diagram illustrating the configuration of one embodiment of a semiconductor amplifying apparatus and a communication terminal apparatus according to the present invention.

FIG. 1 generally illustrates a communication terminal apparatus 8 (hereinafter referred to as the "portable telephone") for use by a user to carry the same with him in a land mobile communication system of the PHS scheme. The portable telephone 8 includes a transmission signal amplifier 9, as a semiconductor amplifying apparatus and a semiconductor amplifier unit, which satisfies a standard value defined for ACP and is adapted to amplify the power of a signal to be transmitted at an efficiency higher than conventional amplifiers.

During transmission, the portable telephone 8 applies a sound signal S1 generated by a microphone 10 to a coder/decoder ("codec") 11. The codec 11, for example, ADPCM (adaptive differential pulse code modulation) encodes the sound signal S1 to produce sound data S2 which is applied to a time-division multiplexer/demultiplexer circuit 12.

The time-division multiplexer/demultiplexer circuit 12 time-division-multiplexes the sound data S2 to produce sound data S3 which is applied to a $\pi/4$ shift QPSK modulator 13. The $\pi/4$ shift QPSK modulator 13 $\pi/4$-shift-QPSK-modulates a local oscillating signal, for example, at 240 MHz with the sound data S3 to produce a modulated signal S4 which is applied to a mixer 14. The mixer 14 modulates a carrier signal S5, for example, at 1.9 GHz with the modulated signal S4 to produce a modulated signal S6 which is applied to a transmission signal amplifier 9. The transmission signal amplifier 9 amplifies the modulated signal S6 to produce a modulated signal S7 which is applied to an antenna 16 through an antenna switch 15.

During reception, the portable telephone 8 applies a received signal S8 received from the antenna 16 to a received signal amplifier 17 through the antenna switch 15. The received signal amplifier 17 amplifies the received signal S8 to produce a received signal S9 which is applied to a mixer 18. The mixer 18 produces an intermediate frequency signal S10 with the received signal S9 and a carrier signal, and applies this intermediate frequency signal S10 to an intermediate frequency amplifier 20. The intermediate frequency amplifier 20 amplifies the intermediate frequency signal S10 to produce an intermediate frequency signal S11 which is applied to a bandpass filter 21.

The bandpass filter 21 extracts only low frequency components from the intermediate frequency signal S11 to produce an intermediate frequency signal S12 which is applied to $\pi/4$ shift QPSK demodulator 22. The $\pi/4$ shift QPSK demodulator 22 $\pi/4$-shift-QPSK-demodulates the intermediate frequency signal S12 to produce sound data S13 which is applied to the time-division multiplexer/demultiplexer circuit 12. The time-division multiplexer/demultiplexer circuit 12 demultiplexes the sound signal S13 to produce sound data S14 which is applied to the codec 11. The codec 11 decodes the sound data S14 to produce a sound signal S15 which is applied to a loud speaker 23. The loud speaker 23 converts the sound signal into speech which is then outputted.

(1-2) Configuration of Transmission Signal Amplifier

Figure 2:
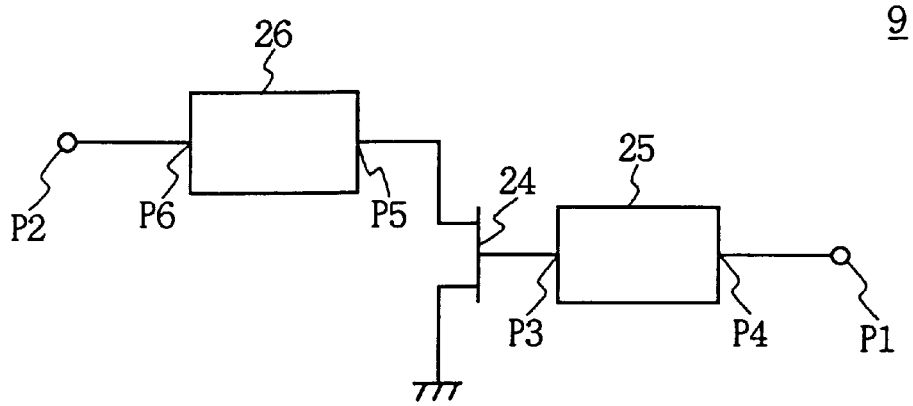
FIG. 2 is a block diagram illustrating a transmission signal amplifier having one stage of amplification, according to the embodiment.

The transmission signal amplifier 9 is wholly implemented in a one-chip integrated circuit, and provides one stage of amplification. As illustrated in FIG. 2, the transmission signal amplifier 9 has a matching circuit 25 as an impedance circuit network inserted between a gate terminal as an input terminal of a GaAs JFET 24 as a transistor and an input terminal P1. Also, the transmission signal amplifier 9 has a matching circuit 26, as the impedance circuit network, inserted between a drain terminal of the GaAs JFET 24 and an output terminal P2.

With this configuration, the transmission signal amplifier 9 exhibits a characteristic curve for a mutual modulation distortion component included in the output power of the GaAs JFET 24 with respect to the input power, which forms, in the middle thereof, a curve section in which an inclination angle of a tangential line to the characteristic curve once becomes smaller, or a curve section which downwardly protrudes (hereinafter, this curve section is referred to as the "inflection section").

One connection terminal P3 of the matching circuit 25 is connected to the gate terminal of the GaAs JFET 24 to match an impedance to the gate. The other connection terminal P4 of the matching circuit 25 is connected to the input terminal P1 to match an impedance to the modulated signal S6. One connection terminal P5 of the matching circuit 26 is connected to the drain terminal of the GaAs JFET 24 to match an impedance to the drain. The other connection terminal P6 is connected to the output terminal P2 to match an impedance to the antenna switch 15.

(1-2-1) Changes in IM and ACP due to Impedance of Matching Circuit

Next, how a fifth mutual modulation distortion component (hereinafter referred to as "$IM_5$") included in the output power of the transmission signal amplifier 9 and ACP vary in accordance with an impedance of a matching circuit viewed from the gate side of the GaAs JFET 24 will be examined by measuring circuits 27, 28 illustrated in FIGS. 3 and 4.

Figure 3:
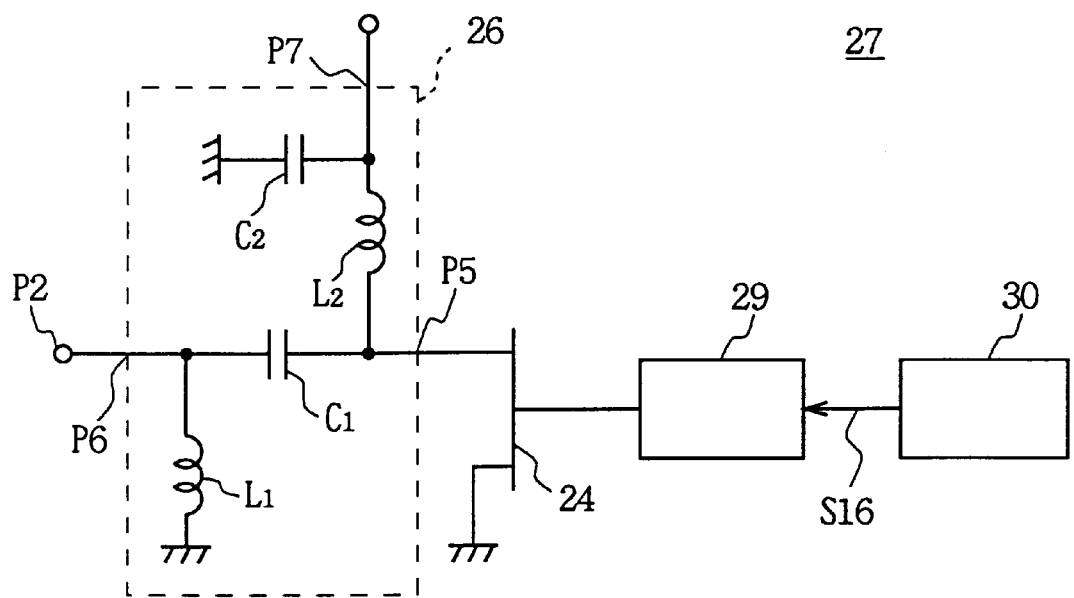
FIG. 3 is a connection diagram illustrating a measuring circuit.

As illustrated in FIG. 3, the measuring circuit 27 includes the GaAs JFET 24 having the gate connected to a modulation signal generator 30 through a tuner 29. The tuner 29 varies an impedance $Z_{es}$ viewed from the gate side of the GaAs JFET 24.

With this configuration, the $\pi/4$-shift-QPSK-modulated signal S16 produced by the modulation signal generator 30 is inputted to the gate terminal of the GaAs JFET 24 with the impedance $Z_{es}$ set by the tuner 29.

The matching circuit 26 connected to the drain terminal of the GaAs JFET 24 has the connection terminal P5 on the drain side and the connection terminal P6 on the output terminal P2 side connected through a capacitor $C_1$, and a connection terminal P7 on the power supply Vdd side and a connection terminal P3 connected through a coil $L_2$. Also, the matching circuit 26 has the connection terminal P6 connected to a ground line through a coil $L_1$, and the connection terminal P7 connected to the ground line through a capacitor $C_2$.

Thus, an output signal varying in accordance with the impedance $Z_{es}$ set by the tuner 29 can be observed at the output terminal P2.

Figure 4:
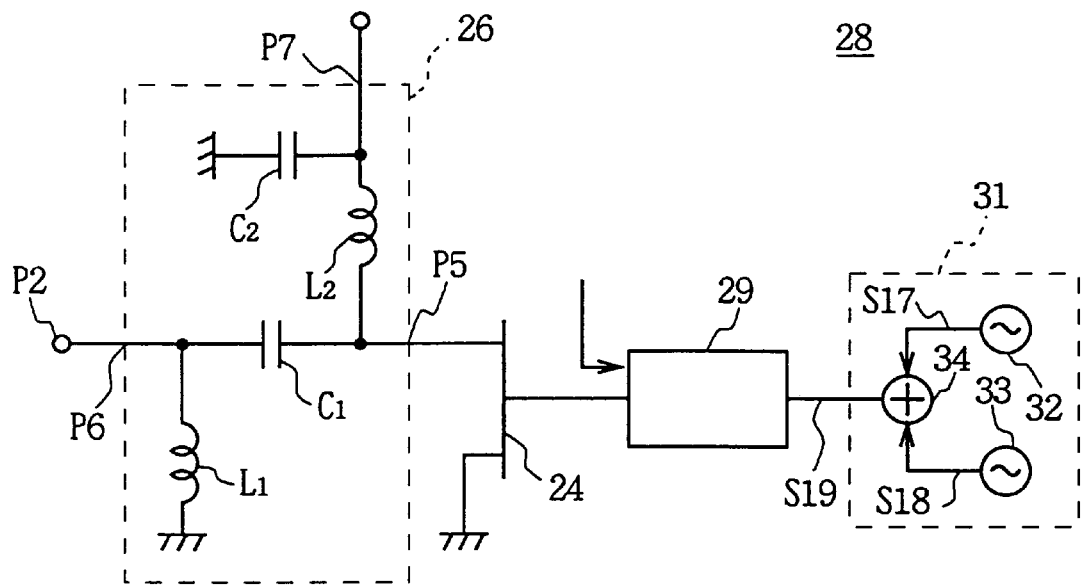
FIG. 4 is a connection diagram illustrating another measuring circuit.

The measuring circuit 28, in turn, is connected to a two-tone signal generator 31 in place of the modulation signal generator 30 in the measuring circuit 27, as illustrated in FIG. 4. The two-tone signal generator 31 includes sine wave generators 32 and 33 which generate output signals S17 and S18, respectively, at frequencies slightly different from each other. The output signals S17 and S18 are added by an adder 34 to produce an addition output signal S19 which is applied to the tuner 29.

Figure 5:
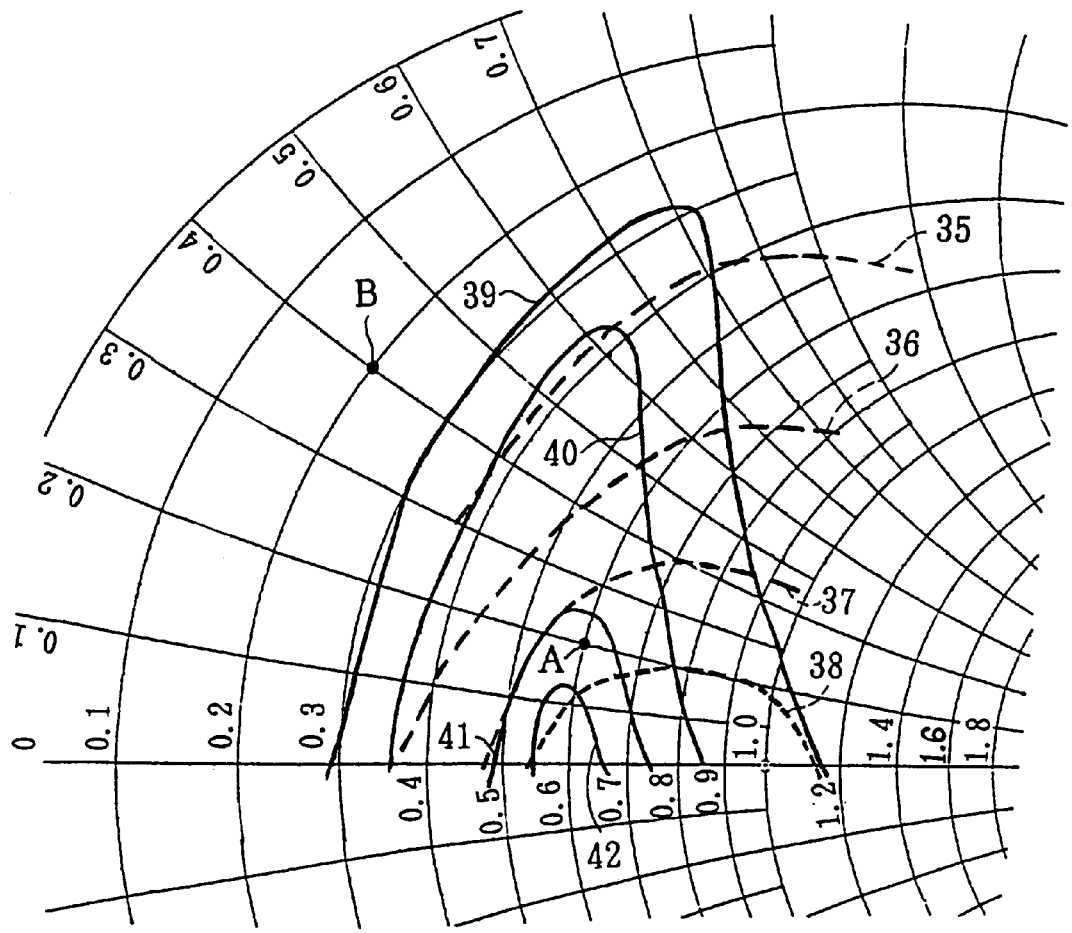
FIG. 5 is a characteristic curve chart illustrating the characteristics of $IM_5$ and ACP with an effective output at 22 dBm.

The measuring circuit 27 is used to plot measured values of ACP with the impedance $Z_{es}$ varied by the tuner 29 when the output power is at 22 dBm, corresponding to the portable telephone 8 of the PHS scheme. The resultant characteristic curves 35 to 38 for ACP are illustrated in FIG. 5, represented by broken lines in the graph. In addition, the measuring circuit 28 is used to plot measured values of $IM_5$ with the impedance $Z_{es}$ varied by the tuner 29 when the output power is at 22 dBm. The resultant characteristic curves 39 to 42 for $IM_5$ are illustrated in FIG. 5, represented by solid lines in the graph.

Figure 30:
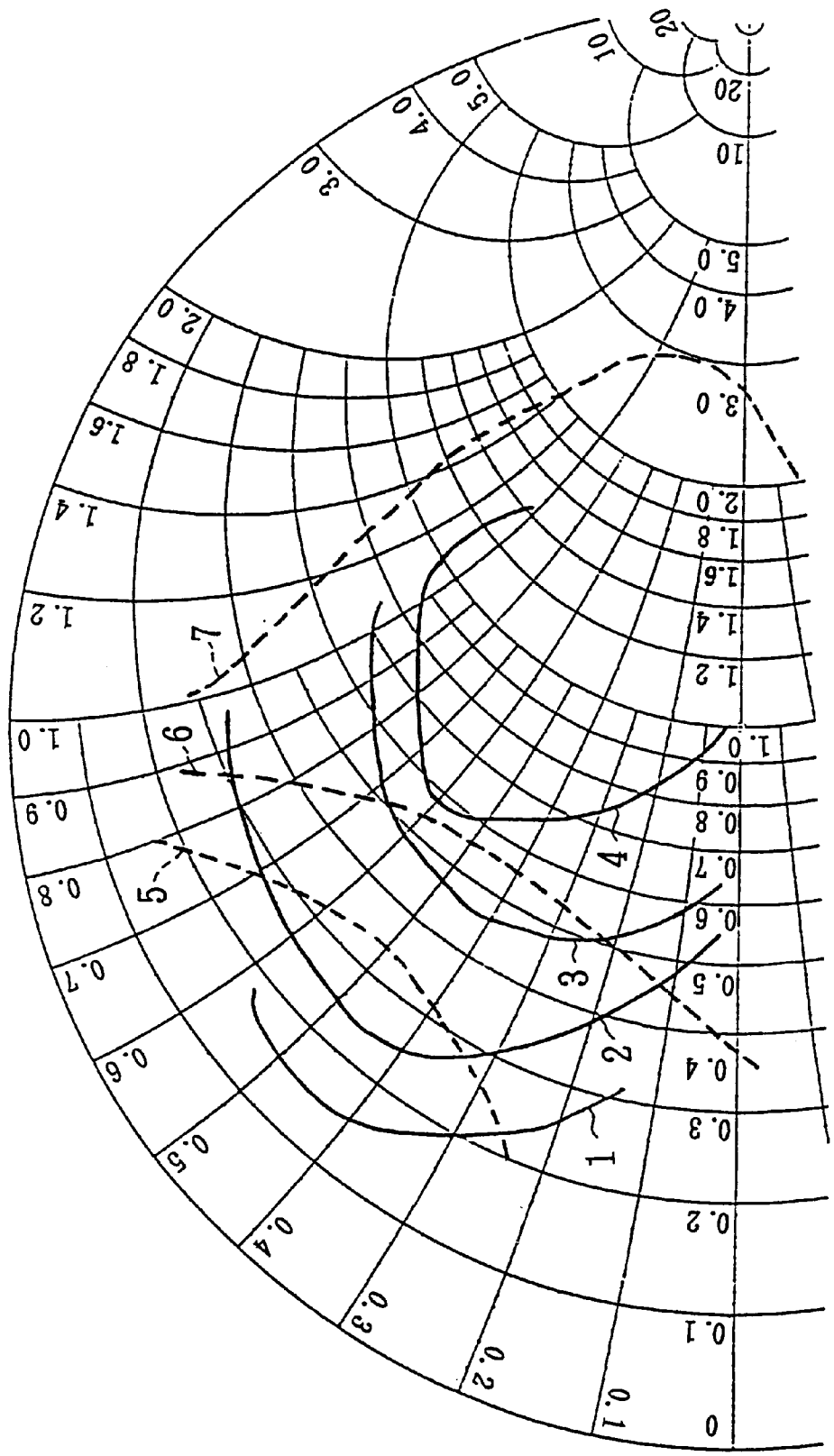
FIG. 30 is a characteristic curve chart illustrating a phase deviation of a fundamental wave and a $Z_{es}$ distribution of an effective output in a prior art semiconductor amplifier.

A current flowing into the GaAs JFET 24 remains at 100 mA irrespective of variations in the impedance $Z_{es}$ as is the case of FIG. 30. It is apparent that a large causal relation exists between the effective output and $IM_5$ from the fact that the respective characteristic curves 35 to 38 and 39 to 42 for $IM_5$ and ACP illustrated in FIG. 5 have quite similar tendencies in increase and decrease in regions defined by the respective curves just in a similar manner to contour lines. The reason for this result will be hereinafter described.

(1-2-2) Causal Relation between Effective Output and $IM_5$

The ACP of the π/4-shift-QPSK-modulated signal S16 is actually determined by $IM_5$ and seventh mutual modulation distortion (hereinafter referred to as the "$IM_7$"), and particularly, $IM_5$ predominantly contributes to the determination.

It can be said from the foregoing that $IM_5$ and ACP of the π/4-shift-QPSK-modulated signal S16 mutually have a deep relation with each other and that their dependencies on the impedance $Z_{es}$ are matching when viewed from the gate terminal side of the GaAs JFET 24.

Figure 6:
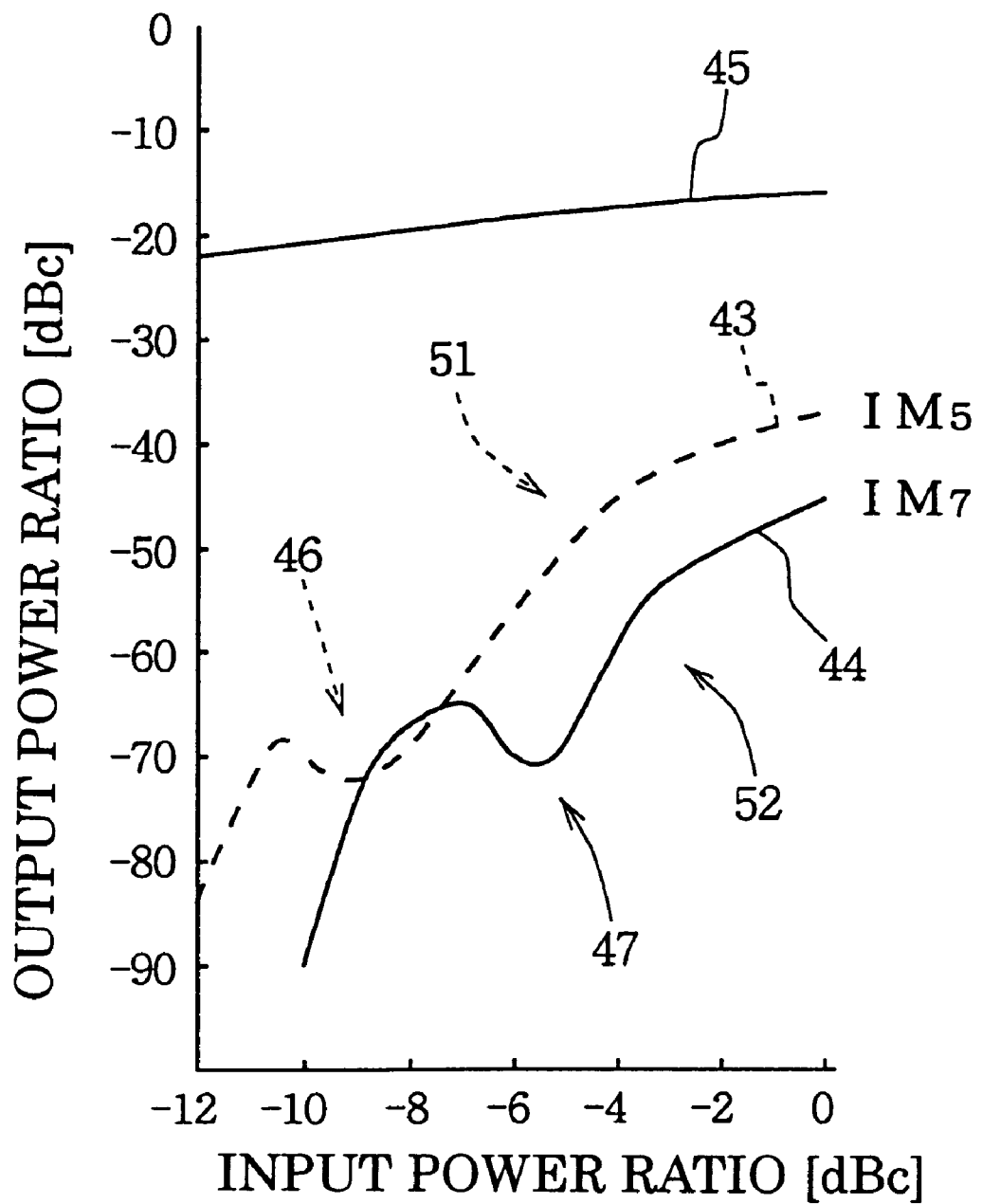
FIG. 6 is graph of characteristic curves illustrating the characteristics of $IM_5$ and $IM_7$ when an impedance viewed from a gate side is $30+j10\Omega$.

FIG. 6 illustrates characteristic curves 43 and 44 for $IM_5$ and $IM_7$ included in output power of the GaAs JFET 24 with respect to input power thereof when the impedance $Z_{es}$ viewed from the gate side of the GaAs JFET 24 is set at an impedance in a region where the effective output is large in FIG. 5, for example, at a point A in the figure, at which $Z_{es}=30+j10\Omega$. As can be seen from FIG. 6, when $Z_{es}=30+j10\Omega$, $IM_5$ and $IM_7$ generally increase in accordance with an increase in the input power, and either of them once exhibits a decrease in the middle of the increase.

Thus, inflection sections 46 and 47 are formed in the middle of the characteristic curves 43 and 44, respectively.

Figure 7:
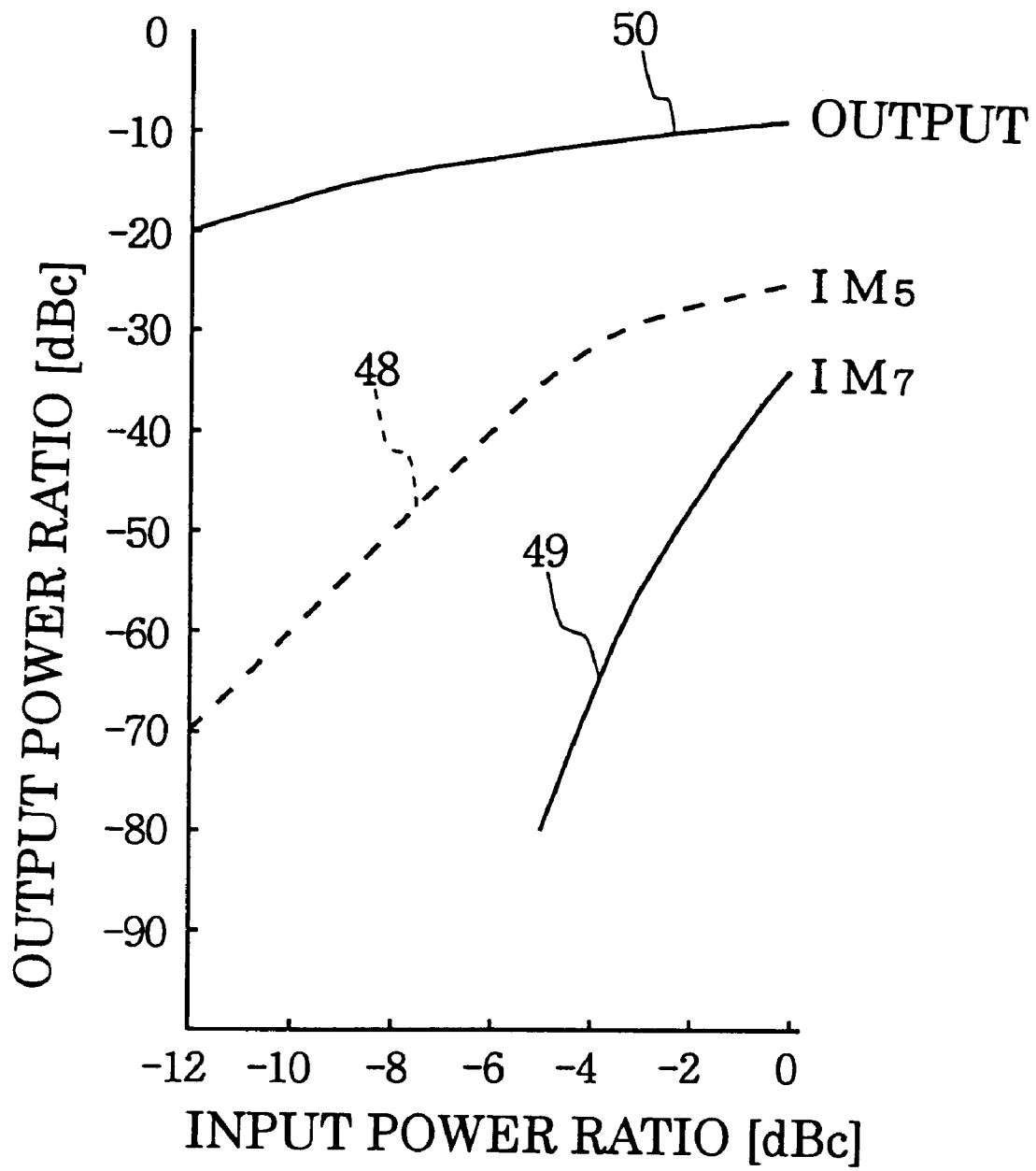
FIG. 7 is a graph of characteristic curves illustrating characteristics of $IM_5$ and $IM_7$ when an impedance viewed from a gate side is $10+j20\Omega$.

FIG. 7, in turn, illustrates characteristic curves 48 and 49 for $IM_5$ and $IM_7$ respectively, included in the output power of the GaAs JFET 24 with respect to the input power when the impedance Zes viewed from the gate side of the GaAs JFET 24 is set at an impedance in a region where the effective output is small in FIG. 5, for example, at a point B in the figure, at which $Z_{es}=10+j20\Omega$. As can be seen from FIG. 7, when $Z_{es}=10+j20\Omega$, $IM_5$, $IM_7$ monotonously increase in accordance with an increase in the input power.

Thus, the characteristic curves 48 and 49 do not include a inflection section formed in the middle of the curves. It can be said from this fact that the effective output differs depending on the impedance $Z_{es}$ viewed from the gate side of the GaAs JFET 24 in FIG. 5 due to the difference between the characteristic curves 43 and 44 for $IM_5$ and $IM_7$ in FIG. 6 and the characteristic curves 48 and 49 for $IM_5$ and $IM_7$ in FIG. 7. In other words, the respective characteristic curves for $IM_5$ and $IM_7$ are formed with an inflection section in the middle, and the degree of change in the inflection section becomes larger in a region where the effective output is larger (i.e., where ACP is smaller) in FIG. 5.

Thus, a curve portion 51 increasing on the right to the boundary with the inflection section 46 of the characteristic curve 43 for $IM_5$ in FIG. 6 is equal to the characteristic curve 48 for $IM_5$ in FIG. 7 shifted to the right on the coordinate system of FIG. 7. Comparing the characteristic curves at the same input power ratio with the impedance $Z_{es}$ set at the point A in FIG. 5, the GaAs JFET 24 behaves equivalently to the case where distortion is reduced. In other words, for reducing distortion when the same input power is applied, the inflection section formed in the middle of the characteristic curve for $IM_5$ plays an important role.

(1-2-3) Equations for Calculating IM

Figure 8:
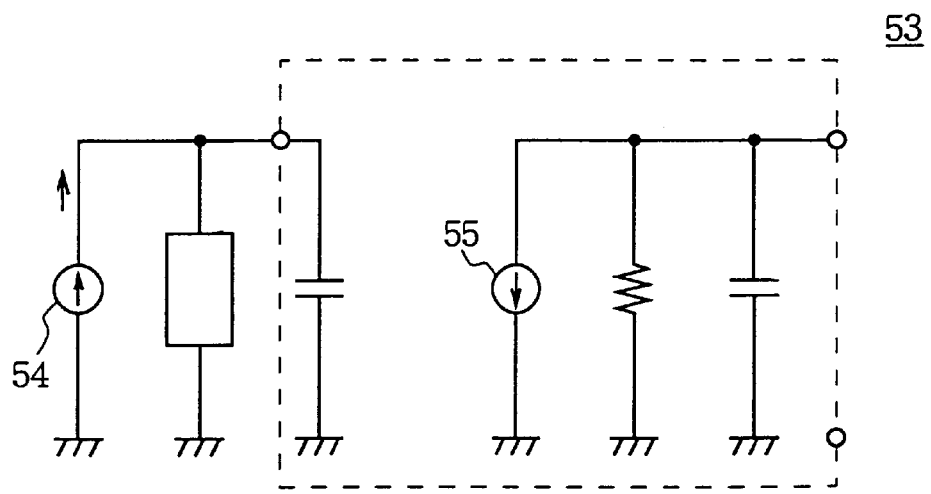
FIG. 8 is a connection diagram illustrating an equivalent circuit for measuring $IM_5$ and $IM_7$.

Next, explanation is given of the reason for which the characteristic curve for $IM_5$ does not simply increase, but rather forms the inflection section in the middle of the curve. The reason for which the inflection section exhibits a different shape depending on the value of the impedance $Z_{es}$ viewed from the gate side of the GaAs JFET 24. Within several candidates considered as causes of the non-linearity of the FET which generates distorted output power, a capacitance Cgs, acting as a predominant cause in a region where the FET substantially linearly operates, is exclusively taken into consideration, and an equivalent circuit 53 illustrated in FIG. 8 is discussed below.

The equivalent circuit 53 includes an equivalent circuit on the gate side which comprises a current source 54 for supplying a current $I_0$ to a two-tone signal generator 31, and an external circuit, specifically a tuner 29, having an impedance $Z_{es}$ and a capacitance Cgs connected in parallel with the current source 54. The equivalent circuit 53 also includes an equivalent circuit on the drain side which comprises a current source 55 for supplying a current expressed by $g_m \times Vg$, where $g_m$ is a mutual conductance and Vg is a gate voltage, and an output conductance $G_d$ and a capacitance Cds between the drain and the gate, connected in parallel with the current source 55.

The impedance $Z_{es}$ is an impedance of a matching circuit viewed from the gate side of the FET. The mutual conductance $g_m$ and the output conductance $G_d$ are assumed to be linear, i.e., the mutual conductance and the output conductance are constant irrespective of an input voltage. Only the capacitance Cgs is a non-linear element depending on the input voltage and generates distortion. Thus, the capacitance Cgs is assumed to be a capacitance in a PN junction model described in an article identified as Michael Shur, "GaAs Devices and Circuit" (published by Plenum Press, U.S.A., 1989). The capacitance Cgs is expressed by the following equation:

Equation 1

$$Cgs = \frac{C_0}{1 - \frac{V_0}{Vt}} \qquad (1)$$

where $C_0$ is a capacitance when the PN junction is open;

Vt is a value of the gate bias voltage—the threshold voltage; and $V_0$ is an input voltage.

In the equivalent circuit 53, when the current $I_0$ is applied from the two-tone signal generator 31, the input voltage $V_0$ is applied to the capacitance Cgs. This causes a distortion component Vg (distorted) to be generated due to the non-linearity of the capacitance Cgs.

An output voltage Vout of the FET is expressed by the following equation:

Equation 2

$$Vout = Gv(Cgs, gm, Gd, Cds) \cdot Vg(\text{distorted}) \qquad (2)$$

where Gv(Cgs, gm, Gd, Cds) is a linear voltage gain of the FET.

For behaviors of the mutual modulation distortion component, a mutual modulation distortion component appearing in this expression Vg (distorted) only is examined. Assuming that angular frequencies of the two output signals S17 and S18 of the two-tone signal generator 31 are ω and ω+δ, respectively, a circuit equation for a gate portion is expressed by the following equation:

Equation 3

$$Cgs \frac{d}{dt} Vg + \frac{Vg}{Z_{es}} = I_0 \{\cos \omega t + \cos (\omega + \delta)t\} \quad (3)$$

Equation (3) shows that a voltage wave Vg causes the generation of an orthogonal component to an input wave on the right side of Equation (3). The amplitude and phase of the voltage wave Vg depend on the input voltage $V_0$ (included in the non-linear component Cgs) and the impedance $Z_{es}$ connected to the gate.

It can thus be anticipated from the fact that the capacitance Cgs non-linearly varies depending on the input voltage $V_0$ that the amplitudes and phases of $IM_5$, $IM_7$, also vary in a non-linear manner with respect to the input voltage $V_0$.

Solving Equation (3), the voltage wave Vg can be expressed by the following equation:

Equation 4

$$Vg = I_0 \{[Gp(1+\cos \delta t) - Gq \sin \delta t] \cos \omega t \quad (4)$$
$$- [Gp \sin \delta t + Gq (1+\cos \delta t)] \sin \omega t\}$$

where Gp is expressed by the following equation:

Equation 5

$$Gp = \frac{R_{e(Zes)}}{a} \quad (5)$$

where $R_{e(Zes)}$ is a real part of the impedance $Z_{es}$. Also, Gq is expressed by the following equation:

Equation 6

$$Gq = \frac{I_{m(Zes)} - \omega Cgs(I_{m(Zes)}^2 + R_{e(Zes)}^2)}{a} \quad (6)$$

where $I_{m(Zes)}$ is an imaginary part of the impedance $Z_{es}$. Further, a in Equation (5) and Equation (6) is expressed by the following equation:

Equation 7

$$a = (1 - \omega Cgs \, I_{m(Zes)})^2 + (\omega Cgs \, R_{e(Zes)})^2 \quad (7)$$

It should be noted that in Equations (5) to (7), since $\omega = 10^9 >> \delta = 10^6$, $\delta$ is omitted in relation to $\omega$. The measurements are made using a tuner 29 having a characteristic impedance equal to 50Ω as the impedance $Z_{es}$, so that the current $I_o$ in Equation (4) is calculated as $I_o = V_0/50$.

Next, the non-linear effect is considered when Gp and Gq are expanded by $V_0^n$. In this event, Equation (5) may be approximated or simplified as follows, regarding that 2ω, 3ω, ... contribute little to $IM_5$, $IM_7$. In other words, $IM_5$, $IM_7$ appear from $V_0^5$, $V_0^7$, $V_0^9$, $V_0^{11}$, ..., including $I_0 = V_0/50$ in Equation (4).

Thus, Equation (5) may be approximately expanded as shown in the following equation:

Equation 8

$$Gp(n\omega, V_0) = Gp(\omega, V_0) = \sum_{n=0}^{\infty} P_n V_0^{2n} \quad (8)$$

Similarly, $Gq = Gq((\omega, V_0)$ may be approximately expanded as shown in the following equation:

Equation 9

$$Gq(n\omega, V_0) = Gq(\omega, V_0) = \sum_{n=0}^{\infty} Q_n V_0^{2n} \quad (9)$$

Although the input voltage $V_0$ is given by the right side of Equation (3), a component of the angular frequency δ (equal to an envelope component) only is considered by the reason set forth above. In other words, assume that $V_0^{2n}$ is expressed by the following equation:

Equation 10

$$(V_0)^{2n} = V_0^{2n} \{\cos \omega t + \cos (\omega + \delta)t2\}^{2n} \quad (\delta \text{ component}) \quad (10)$$
$$= V_0^{2n} \{1 + \cos (\delta t)\}^n$$

Substituting this Equation (10) into Equation (8), the following equation is derived:

Equation 11

$$Gp = \sum_{n=0}^{\infty} P_n V_0^{2n} = \sum_{n=0}^{\infty} P_n V_0^{2n} (1 + \cos \delta t)^n \quad (11)$$

Also, substituting Equation (10) into Equation (9), the following equation is derived:

Equation 12

$$Gq = \sum_{n=0}^{\infty} Q_n V_0^{2n} = \sum_{n=0}^{\infty} Q_n V_0^{2n} (1 + \cos \delta t)^n \quad (12)$$

$P_n$ and $Q_n$ in Equation (11) and Equation (12) are coefficients derived when Gp and Gq, which are calculated by Equations (5) to (7) with fixed ω by varying the input voltage $V_0$, are approximated by Equation (8) and Equation (9). As can be seen from Equation (5) to Equation (7), $P_n$ and $Q_n$ include the value of the impedance $Z_{es}$.

Substituting Equation (11) and Equation (12) into Equation (4), and rearranging Equation (4), the following equation is derived:

Equation 13

$$Vg = I_0 \left\{ \sum_{n=0}^{\infty} P_n V_0^{2n}(1 + \cos \delta t)^{n+1} - \sum_{n=0}^{\infty} Q_n V_0^{2n}(1 + \cos \delta t)^n \sin \delta t \right\} \cos \omega t - I_0 \left\{ \sum_{n=0}^{\infty} P_n V_0^{2n}(1 + \cos \delta t)^n \sin \delta t + \sum_{n=0}^{\infty} Q_n V_0^{2n}(1 + \cos \delta t)^{n+1} \right\} \sin \omega t \qquad (13)$$

As can be seen from Equation (13), many waves ($\omega \pm n\delta$) are generated around the angular frequency $\omega$. These waves are mutual modulation distortion components. $IM_5$ exists on both sides at $\omega+3\delta$ and $\omega-2\delta$, while $IM_7$ exists on both sides at $\omega+4\delta$ and $\omega-3\delta$. However, only one of them is discussed in the present calculation since they are both symmetric.

When $IM_5$ is derived by expanding Equation (13), components of $IM_5$ appear from n=4, 6, 8, 10, . . . . In other words, $IM_5$ is expressed by a combination of a plurality of waves generated from the respective orders.

In Equation (13), an orthogonal component appears with respect to the input signal on the right side of Equation (3). In other words, Equation (13) represents the amplitudes and phases of the fundamental wave and mutually modulated waves.

From Equation (13), it can be anticipated that the amplitudes and phases vary depending on the input voltage $V_0$. It is therefore possible, by calculating a particular mutual modulation distortion component from Equation (13), to reveal how the amplitude and phase of the component vary with respect to the input signal.

The voltage wave Vg of $IM_5$ is derived from the following equation by calculating Equation (13) with n varying from 0 to 5: Equation 14

$$Vg_{(IM5)} = A \cos(\omega+3\delta)t - B \sin(\omega+3\delta)t \qquad (14)$$

where A in Equation (14) is derived by the following equation:

Equation 15

$$A = I_0 \left\{ \frac{1}{4} P_2 V_0^4 + \frac{7}{8} P_3 V_0^6 + \frac{72}{32} P_4 V_0^8 + \frac{165}{32} P_5 V_0^{10} \right\} \qquad (15)$$

and B in Equation (14) is derived by the following equation:

Equation 16

$$B = I_0 \left\{ \frac{1}{4} Q_2 V_0^4 + \frac{7}{8} Q_3 V_0^6 + \frac{72}{32} Q_4 V_0^8 + \frac{165}{32} Q_5 V_0^{10} \right\} \qquad (16)$$

Similarly, the voltage wave Vg of $IM_7$ is derived from the following equation by calculating Equation (13) with n varying from 0 to 6:
Equation 17

$$Vg_{(IM7)} = C \cos(\omega+3\delta)t - D \sin(\omega+3\delta)t \qquad (17)$$

where C in Equation (17) is derived by the following equation:

Equation 18

$$C = I_0 \left\{ \frac{1}{8} P_3 V_0^6 + \frac{9}{16} P_4 V_0^8 + \frac{110}{32} P_5 V_0^{10} + \frac{143}{32} P_6 V_0^{12} \right\} \qquad (18)$$

and D in Equation (14) is derived by the following equation:

Equation 19

$$D = I_0 \left\{ \frac{1}{8} Q_3 V_0^6 + \frac{9}{16} Q_4 V_0^8 + \frac{110}{32} P_5 V_0^{10} + \frac{143}{32} P_6 V_0^{12} \right\} \qquad (19)$$

Thus, it can be seen that $IM_5$ is a wave which has a voltage amplitude V expressed by the following equation:
Equation 20

$$V_{IM5} = A^2 + B^2 \qquad (20)$$

and a phase $\phi$ expressed by the following equation:

$$\varphi_{IM5} = -\tan^{-1} \frac{B}{A} \qquad (21)$$

Similarly, it can be seen that $IM_7$ is a wave having a voltage amplitude V expressed by the following equation:
Equation 22

$$V_{IM7} = C^2 + D^2 \qquad (22)$$

and a phase $\phi$ expressed by the following equation:

$$\varphi_{IM7} = -\tan^{-1} \frac{D}{C} \qquad (23)$$

As described above, $P_n$, $Q_n$ included in A, B, C, D in Equations (20) to (23) depend on the impedance $Z_{es}$ connected to the gate. Thus, $IM_5$ and $IM_7$ simultaneously vary in accordance with the impedance $Z_{es}$.

It is therefore possible to examine how $IM_5$ and $IM_7$ vary in accordance with the impedance $Z_{es}$ from Equations (20) to (23). In the following, a description will be provided in this respect.

(1-2-4) Comparison between Calculated Values and Measured Values of IMs:

FIGS. 9 to 16 illustrate characteristic curves 56 to 63 based on calculated values of $IM_5$, $IM_7$ with respect to input power applied from the two-tone signal generator 31 and characteristic curves 64 to 71 based on measured values of the same.

FIGS. 9, 11, 13 and 15 indicate calculated values of $IM_5$ with white triangular marks and measured values of $IM_5$ with white circular marks when the impedance $Z_{es}$ is $Z_{es}$=30+j20, $Z_{es}$=10+j20, $Z_{es}$=40+j40, and $Z_{es}$=60+j30, respectively. FIGS. 10, 12, 14 and 16 in turn indicate calculated values of $IM_7$ with white triangular marks and measured values of $IM_7$ with white circular marks when the impedance $Z_{es}$ is $Z_{es}$=30+j20, $Z_{es}$=10+j20, $Z_{es}$=40+j40, and $Z_{es}$=60+j30, respectively.

Figure 9:
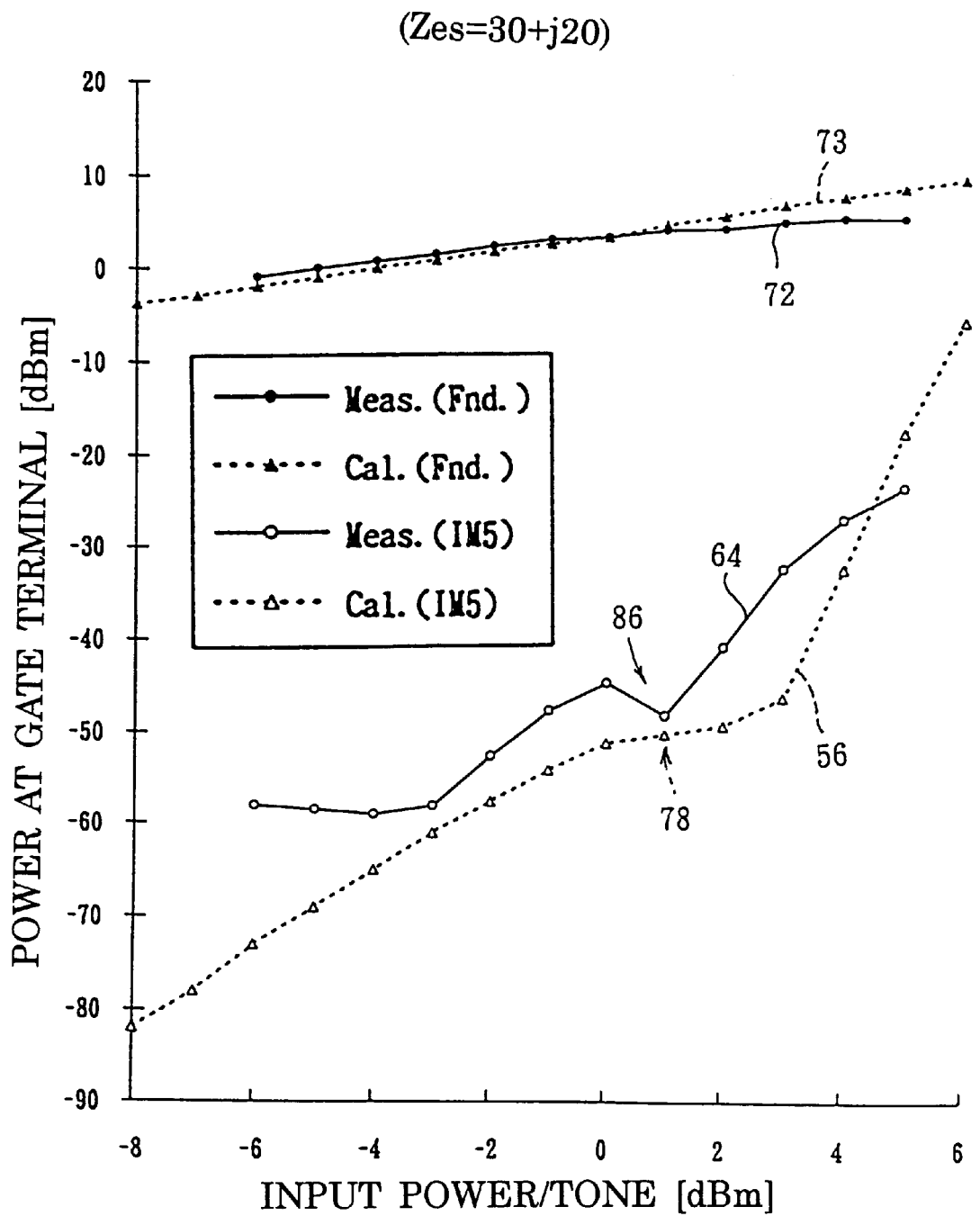
FIG. 9 is a graph of characteristic curves illustrating calculated values and measured values of a fundamental wave and $IM_5$.
Figure 10:
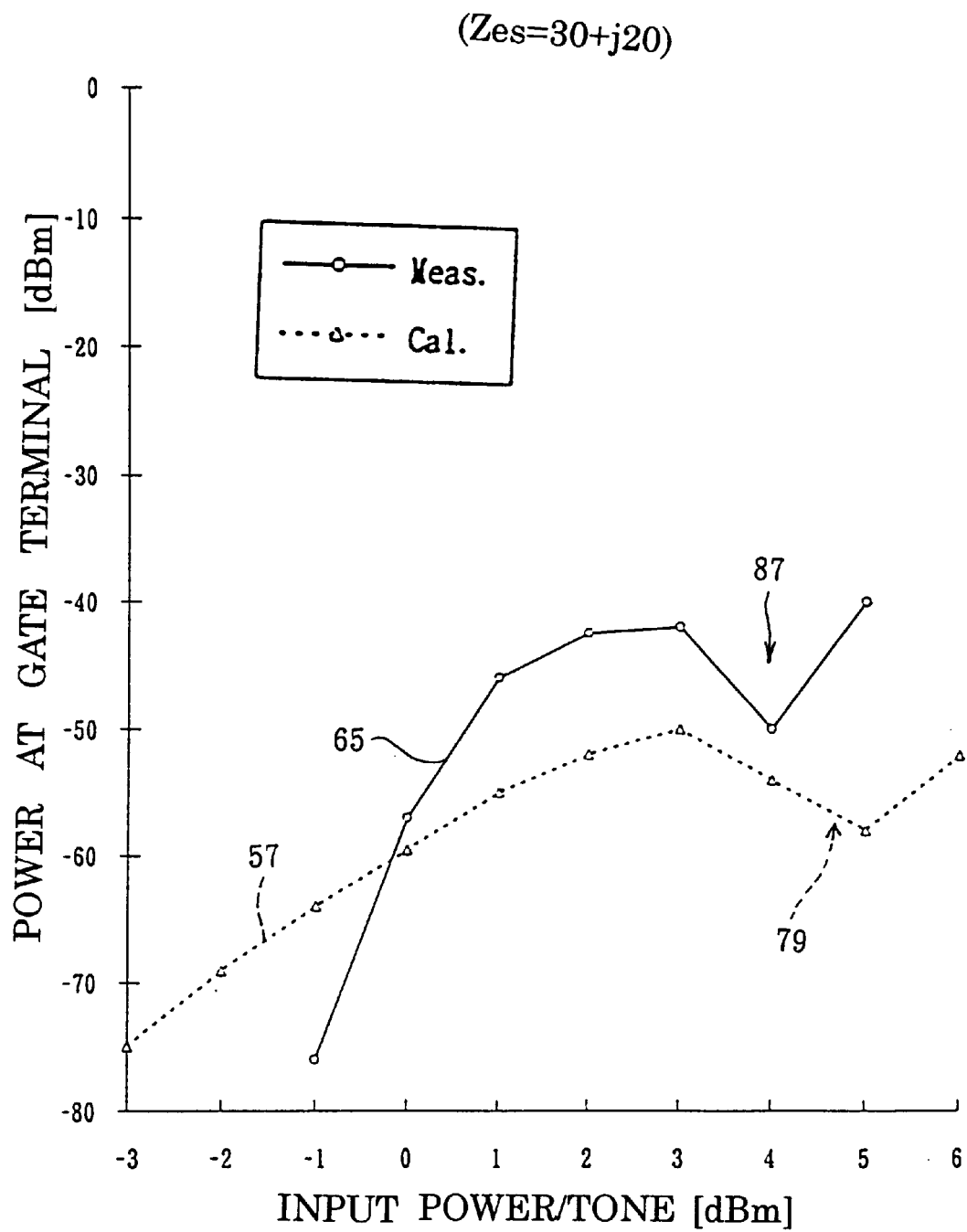
FIG. 10 is a graph of characteristic curves illustrating calculated values and measured values of $IM_7$.
Figure 11:
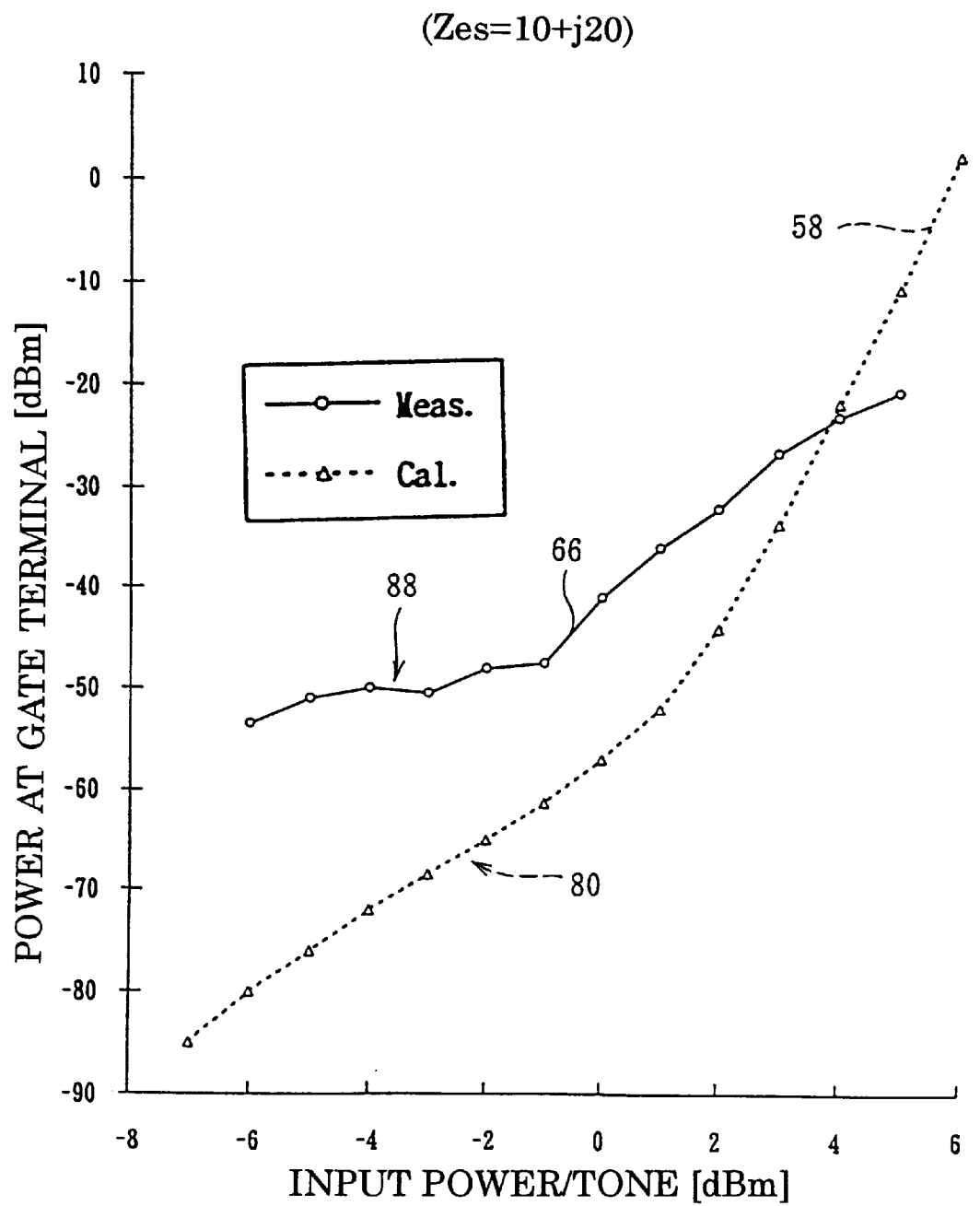
FIG. 11 is a graph of characteristic curves illustrating calculated values and measured values of $IM_5$.
Figure 12:
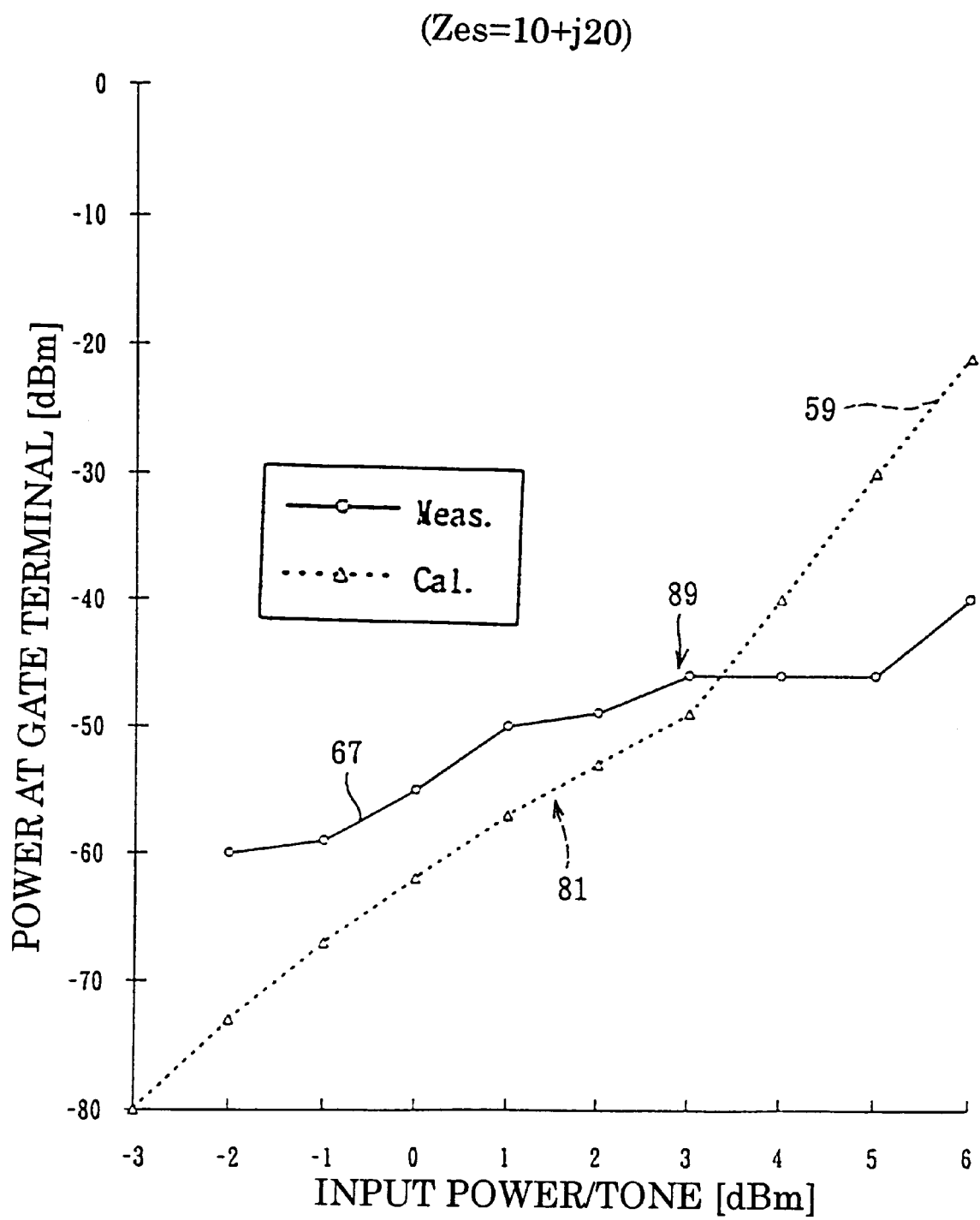
FIG. 12 is a graph of characteristic curves illustrating calculated values and measured values of $IM_7$.
Figure 13:
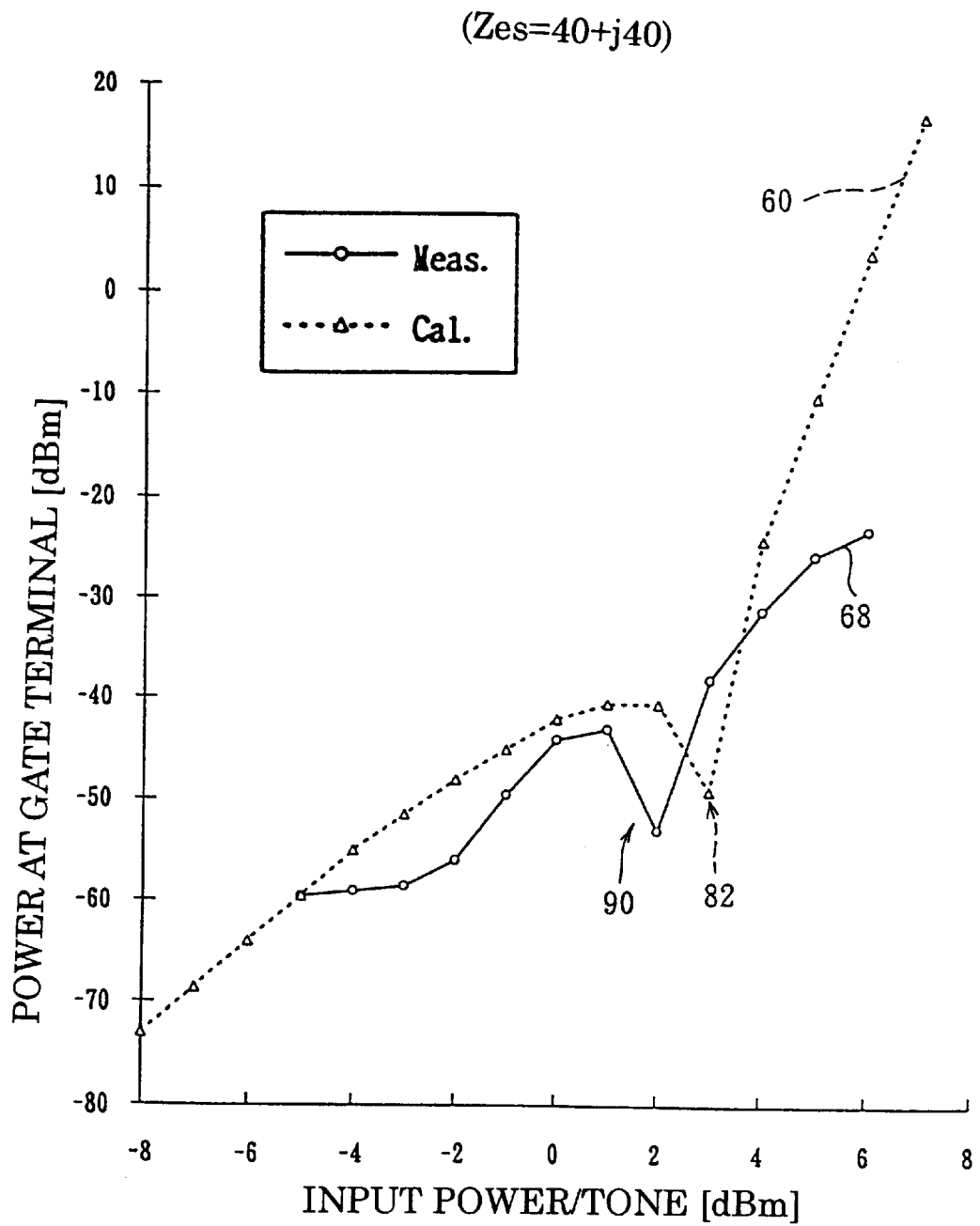
FIG. 13 is a graph of characteristic curves illustrating calculated values and measured values of $IM_5$.
Figure 14:
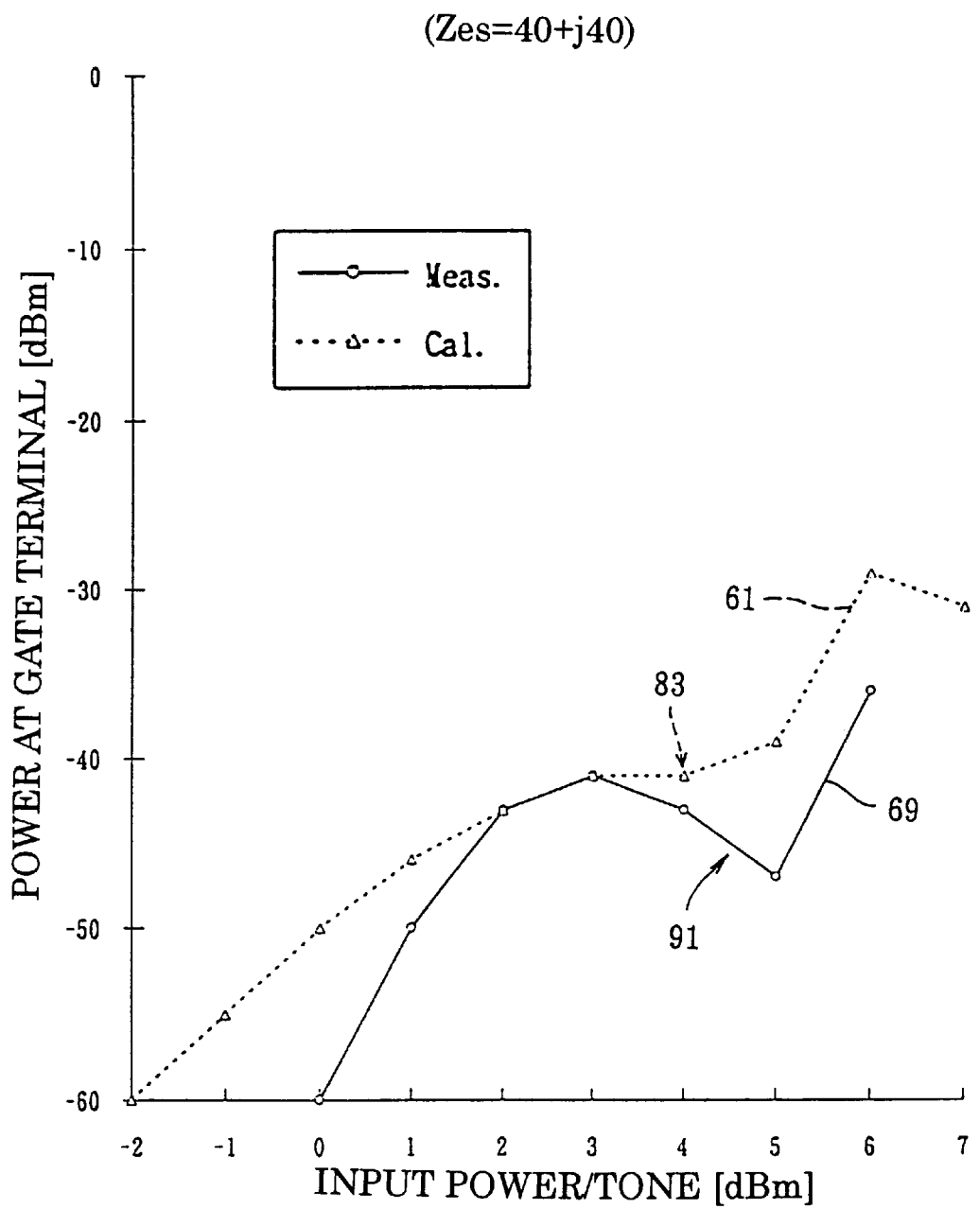
FIG. 14 is a graph of characteristic curves illustrating calculated values and measured values of $IM_7$.
Figure 15:
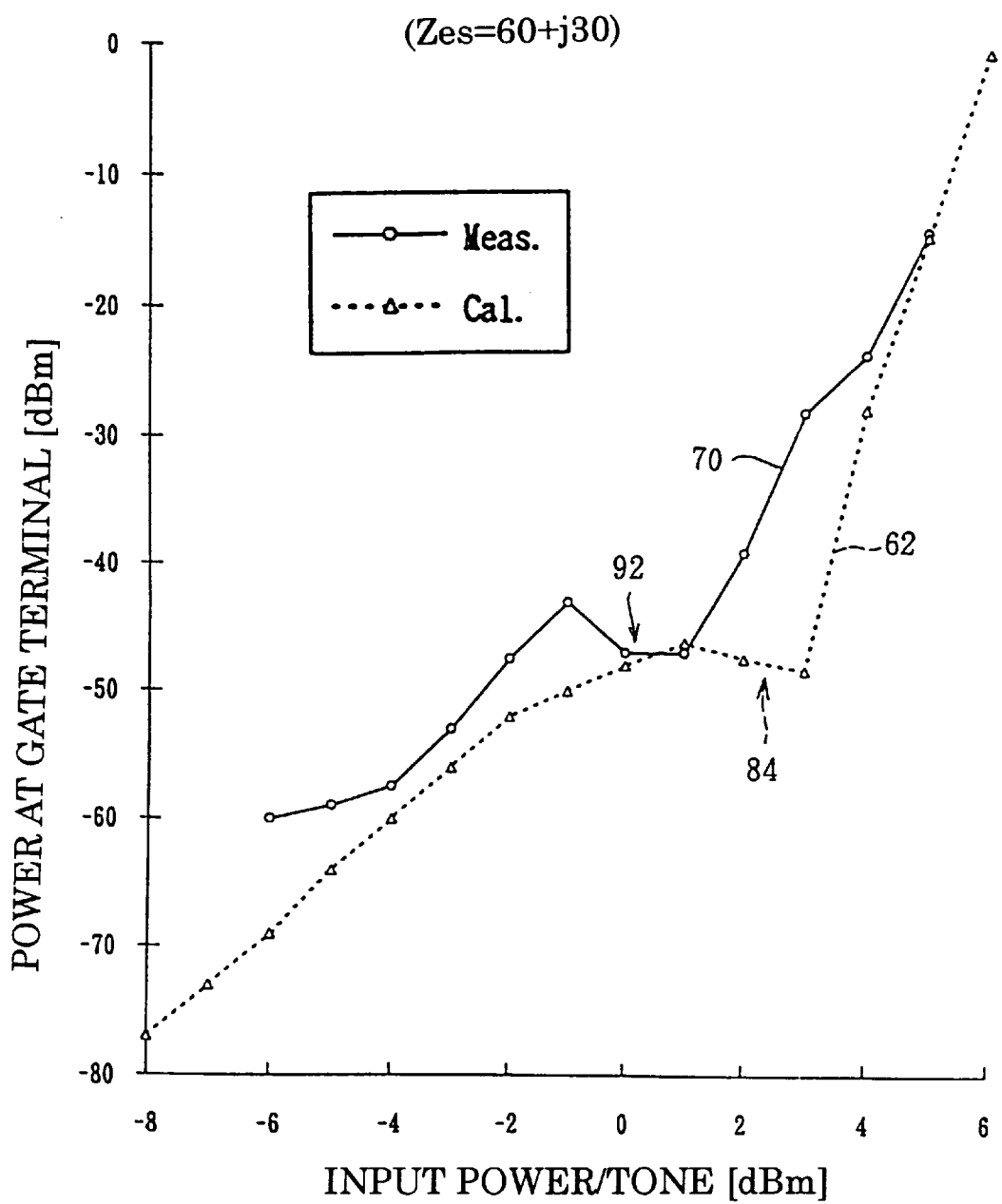
FIG. 15 is a graph of characteristic curves illustrating calculated values and measured values of $IM_5$.
Figure 16:
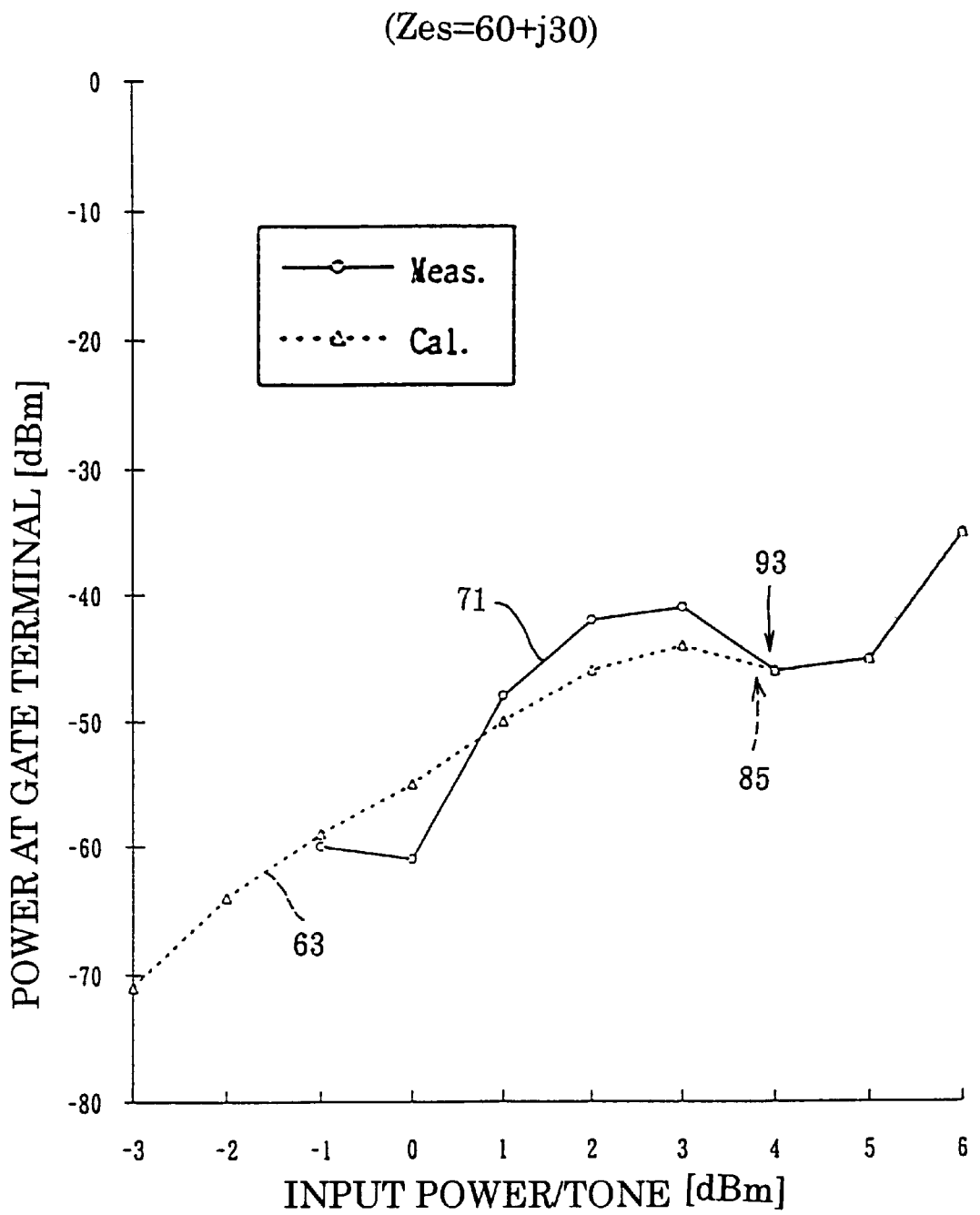
FIG. 16 is a graph of characteristic curves illustrating calculated values and measured values of $IM_7$.

In addition, FIG. 9 illustrates a characteristic curve 72 based on measured values and a characteristic curve 73 based on calculated values of one of the fundamental wave components of the two tone signals. FIG. 9 indicates the calculated values with black triangular marks and the measured values with black circular marks.

When the characteristic curves 64 to 71 based on the measured values in FIGS. 9 to 16 are derived, a tuner is connected to each of the gate and the drain of a FET. An impedance $Z_L$ of the tuner on the drain side is fixed at $Z_L$=20+j10Ω at which the FET used in the measurements exhibits a full output.

For the value of the impedance $Z_{es}$, a value in the second quadrant of the Smith chart is arbitrarily selected. The arbitrary selection is made in order to ensure a gain required to design a power amplifier by selecting the impedance $Z_{es}$ in a region as near as possible to the point at which the impedance matches with the gate of the FET.

It can be said that $IM_5$, $IM_7$ exhibit fairly matching measured values and calculated values, respectively, by comparing the characteristic curves 56 to 63 based on the calculated values and the characteristic curves 64 to 71 based on the measured values in FIGS. 9 to 16.

The calculation of the fundamental wave component illustrated in FIG. 9 employs Equation (10) with n=0. The measured values of the fundamental wave component in FIG. 9 show saturation with respect to an increase in input. On the other hand, no saturation appears in the calculated values. This is because the calculations are made without considering the effect of the non-linear elements except for the capacitance Cgs. More specifically, since non-linear terms appear for non-linear components other than the capacitance Cgs in a region where the input voltage $V_0$ is larger, larger errors are included in the aforementioned calculations.

Figure 17:
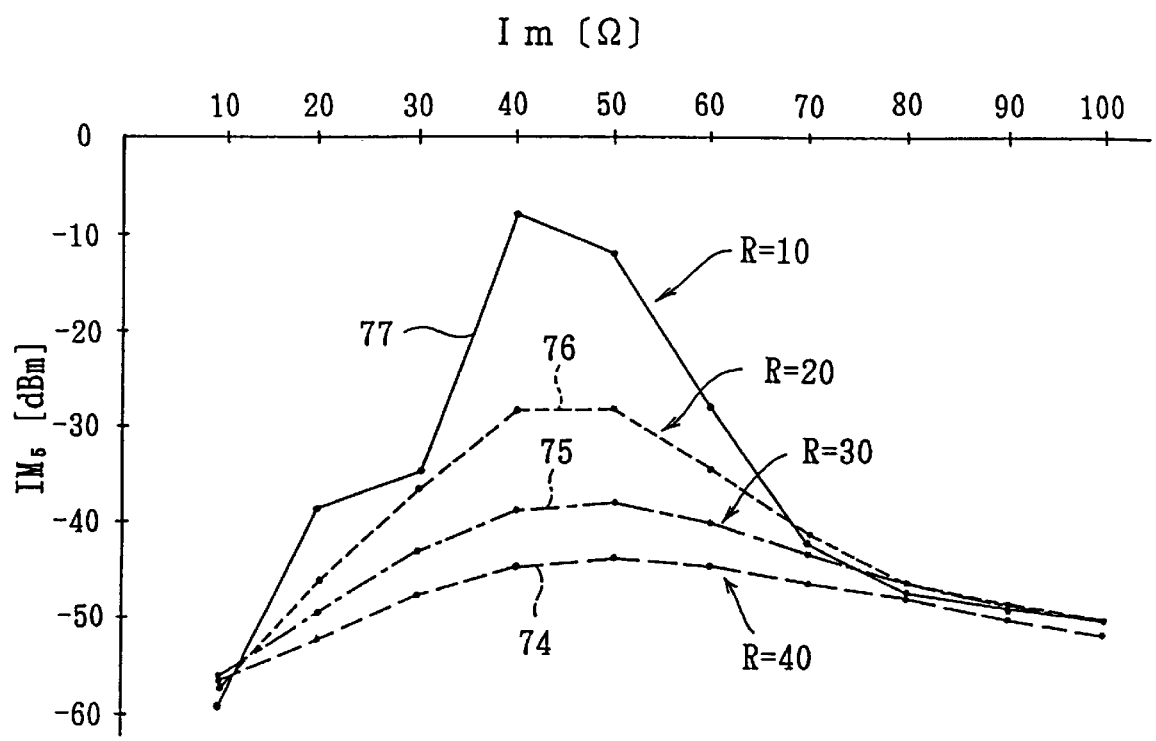
FIG. 17 is a graph of characteristic curves illustrating variations in $IM_5$ with respect to an impedance $Z_{es}$ when $P_{in}=3$ dBm.

FIG. 17 illustrates characteristic curves 74 to 77 based on calculated values of $IM_5$ with respect to the impedance $Z_{es}$ when the input power Pin is 3 dBm. The calculated values of $IM_5$ becomes larger as a real part R in $Z_{es}$=R+jIm is smaller, and exhibits a maximum value when an imaginary part Im is near 40Ω (Im=40).

In the GaAs JFET 24 for which the measurements have been made at this time, an impedance $Z_i$ at which the gain presents a maximum value is substantially coincident with an impedance $Z_{es}$ at which $IM_5$ becomes large. This means that a power amplifier must be designed in consideration of a contrary relation between $IM_5$ and the gain.

The values of $C_0$ and [(bias voltage)—(threshold voltage)] Vt, used in the calculations, are chosen to be 1.6 pF and 0.75 V, respectively, from measured values of the FET. Also, from the configuration of the equivalent circuit 53 illustrated in FIG. 8, the current $I_0$ of the two-tone signal generator 31 is determined to be $I_0$=$V_0$/50, using the value of the characteristic impedance of the tuner 29, i.e., 50Ω.

The measured values and calculated values of IMs seen in FIGS. 9 to 16 are characterized in that they do not monotonously increase but include inflection sections 78 to 93 formed in the middle of the characteristic curves 56 to 71 based on the measured values and calculated values, respectively. It can be also said that the degrees of inflections in the inflection sections 78 to 93 also depend on the impedance $Z_{es}$.

(1-2-5) Consideration on Formation of Inflection Sections

Here, consideration will be made on the formation of the inflection sections. The $V_{g(IM5)}$ component expressed in Equations (14) to (16) may be rewritten to the following equation:

Equation 24

$$V_{g(IM5)} = V_{IM55} + V_{IM57} + V_{IM59} + V_{IM511} \quad (24)$$

where $V_{IM55}$ is a fifth component vector, $V_{IM57}$ is a seventh component vector, $V_{IM59}$ is a ninth component vector, and $V_{IM511}$ is an eleventh component vector.

The component vectors $V_{IM55}$, $V_{IM57}$, $V_{IM59}$, and $V_{IM511}$ are expressed by the following equations, respectively:

Equation 25

$$V_{IM55} = \frac{1}{4} V_0^5 P_2^2 + Q_2^2 \sin\left\{\omega t - \tan^{-1} \frac{Q_2}{P_2}\right\} \quad (25)$$

Equation 26

$$V_{IM57} = \frac{7}{8} V_0^7 P_3^2 + Q_3^2 \sin\left\{\omega t - \tan^{-1} \frac{Q_3}{P_3}\right\} \quad (26)$$

Equation 27

$$V_{IM59} = \frac{72}{16} V_0^9 P_4^2 + Q_4^2 \sin\left\{\omega t - \tan^{-1} \frac{Q_4}{P_4}\right\} \quad (27)$$

Equation 28

$$V_{IM511} = \frac{165}{32} V_0^{11} P_5^2 + Q_5^2 \sin\left\{\omega t - \tan^{-1} \frac{Q_5}{P_5}\right\} \quad (28)$$

$V_{g(IM5)}$ is expressed by a vector addition of the four waves expressed by the Equation (25) to Equation (28). The component vector $V_{IM55}$, $V_{IM57}$, $V_{IM59}$, and $V_{IM511}$ are components of $IM_5$ generated from each term of Equation (11) and Equation (12) when n is 5, 7, 9, and 11, respectively.

In a region where the input voltage $V_0$ is small, the fifth component vector $V_{IM55}$ is predominant. On the other hand, in a region where the input voltage $V_0$ is extremely large, the eleventh component vector $V_{IM511}$ is predominant. In an intermediate region, $IM_5$ can be subtracted due to the phase relationship among the respective component vectors $V_{IM55}$, $V_{IM57}$, $V_{IM59}$, and $V_{IM511}$. The inflection sections formed in the middle of the characteristic curves are generated as a result of this subtraction.

Since a similar analysis and conclusion are applied to $IM_7$, detailed description relating to $IM_7$ is omitted in this respect.

Figure 18:
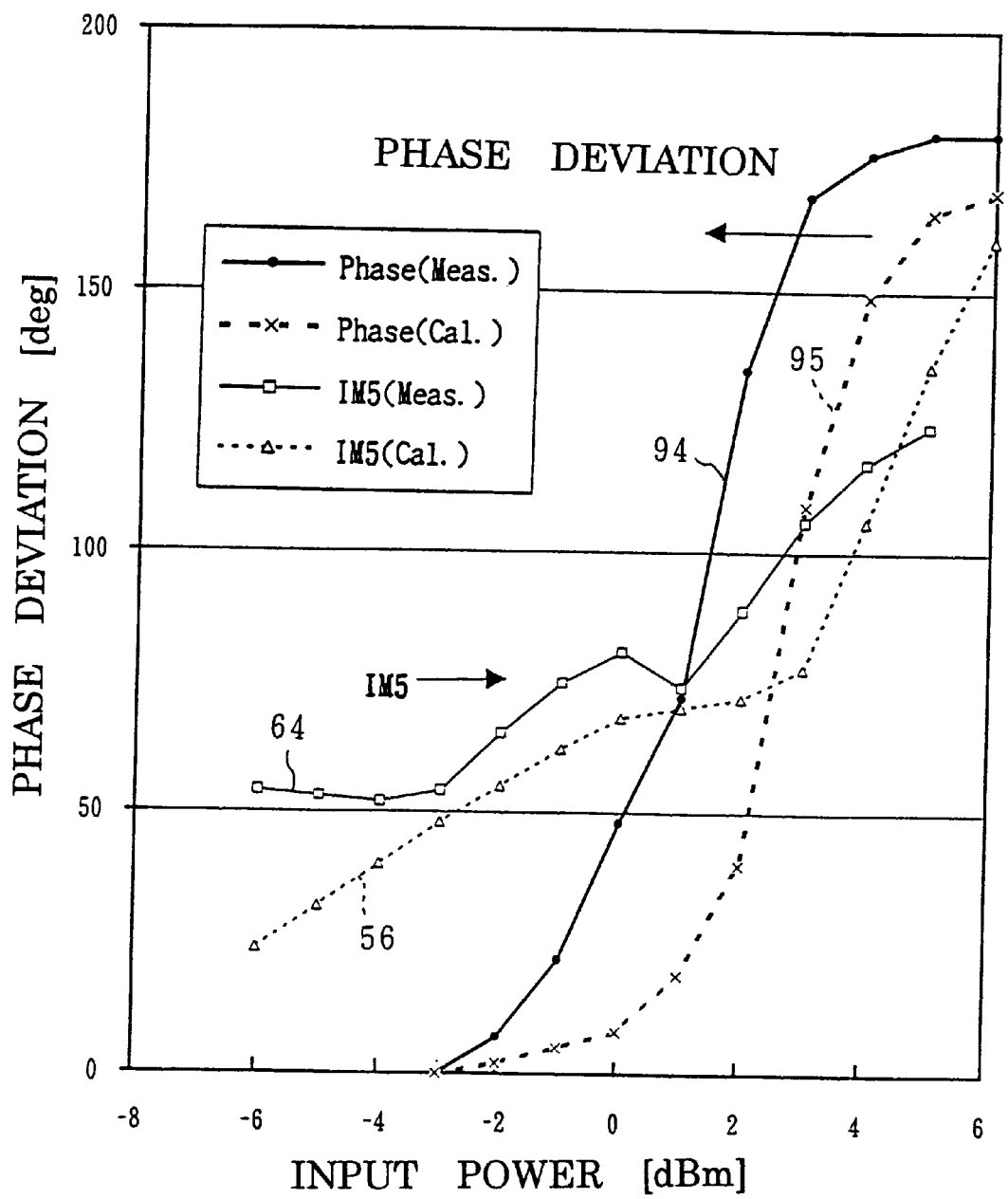
FIG. 18 is a graph of characteristic curves illustrating calculated values and measured values of a phase deviation of $IM_5$.

The component vectors $V_{IM55}$, $V_{IM57}$, $V_{IM59}$, and $V_{IM511}$ are degenerated within $IM_{IM5}$ and therefore cannot be observed separately. It is thought, however, that these component vectors can be indirectly found by measuring the phase of $IM_5$. FIG. 18 illustrates a characteristic curve 64 based on examples of measured values of $IM_5$ and a characteristic curve 56 based on calculated values of the same as well as a characteristic curve 94 based on examples of measured values of a phase deviation of this $IM_5$ and a characteristic curve 95 based on calculated values of the same. In FIG. 18, the phase in a region where the input voltage $V_0$ is small is the phase of the fifth component vector $VM_{IM55}$, and the phases of higher order element vectors with n equal to or larger than seven, i.e., $V_{IM57}$, $V_{IM59}$, and $V_{IM511}$ are thought to appear in a region where the input voltage $V_0$ is large.

Distortion generated in a power amplifying FET for a π/4-shift-QPSK-modulated wave is defined by ACP. The value of ACP in a portable telephone of the PHS scheme or the like is determined mainly by $IM_5$ and $IM_7$, wherein $IM_5$ is particularly predominant. As described above, the cause of the deteriorated ACP is a mutual modulation distortion.

(1-2-6) Effect of Inflection Section on Characteristic Curve of IM

Figure 19:
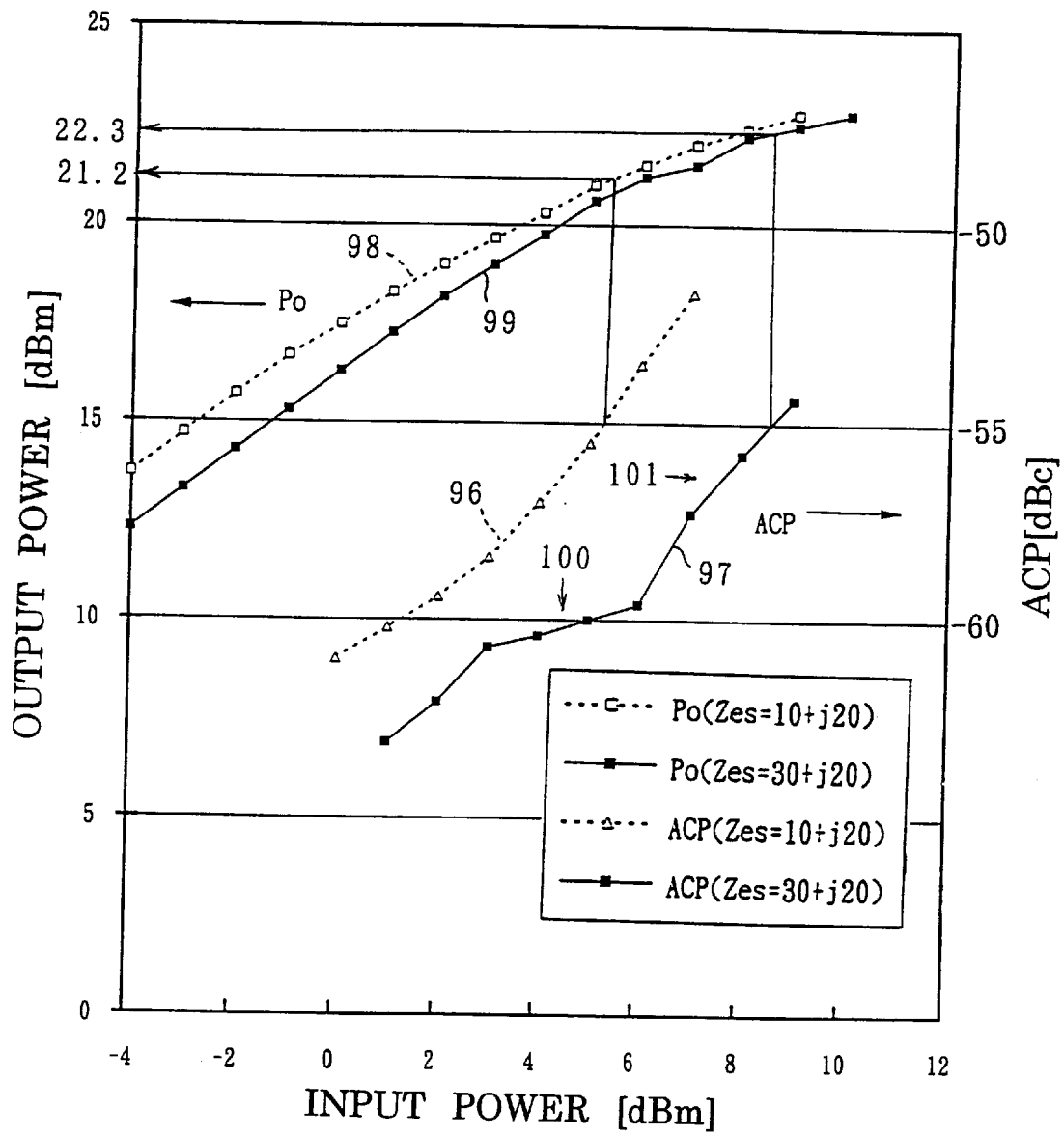
FIG. 19 is a graph of characteristic curves illustrating the characteristics of output power and ACP for each impedance $Z_{es}$.

FIG. 19 illustrates a characteristic curve 96 based on measured values of ACP when a π/4-shift-QPSK-modulated signal is inputted to a power amplifying FET and the impedance $Z_{es}$ is set at $Z_{es}$=10+j20, and a characteristic curve 97 based on measured values of ACP when the impedance $Z_{es}$ is set at $Z_{es}$=30+j20. FIG. 19 also illustrates characteristic curves 98, 99 based on measured values of output power for each of the two settings of the impedance $Z_{es}$.

The characteristic curve 96 for ACP is not formed with a inflection section, while the characteristic curve 97 for ACP is apparently formed with a inflection section 100. This inflection section 100 is caused by the inflection sections formed in the aforementioned $IM_5$, $IM_7$.

The characteristic curve 97 for ACP has a curve portion 101, which rises on the right of the boundary with the inflection section 100, shifted to the right on the coordinate system of the graph, as compared with a characteristic curve which is not formed with an inflection section in the middle.

It can be understood from the foregoing that distortion is reduced with the same output, as compared with the characteristic curve 96 without inflection section formed in the middle, in a region where the output is larger than that corresponding to the inflection section 100. For example, comparing the output power $P_0$ at ACP=-55 dBc between the characteristic curves 98 and 99 in FIG. 19, $P_0$ is equal to 21.2 dBm (=132 mW) on the characteristic curve 98 for the output power corresponding to the characteristic curve 96 for ACP without inflection section, while $P_0$ is equal to 22.3 dBm (=170 mW) on the characteristic curve 99 for the output power corresponding to the characteristic curve for ACP formed with an inflection section. It can be seen that an output voltage difference as much as 1.2 dB is generated.

Conversely, when comparing the output point at 22.0 dBm, ACP is equal to -53 dBc on the characteristic curve 96 for ACP corresponding to the characteristic curve 98 for the output power, while ACP is equal to -56 dBc on the characteristic curve 97 for ACP corresponding to the characteristic curve 99 for the output power. Thus, the distortion is improved by 3 dB. It can therefore be said that the distortion is corrected by the formation of the inflection section 100.

Figure 20:
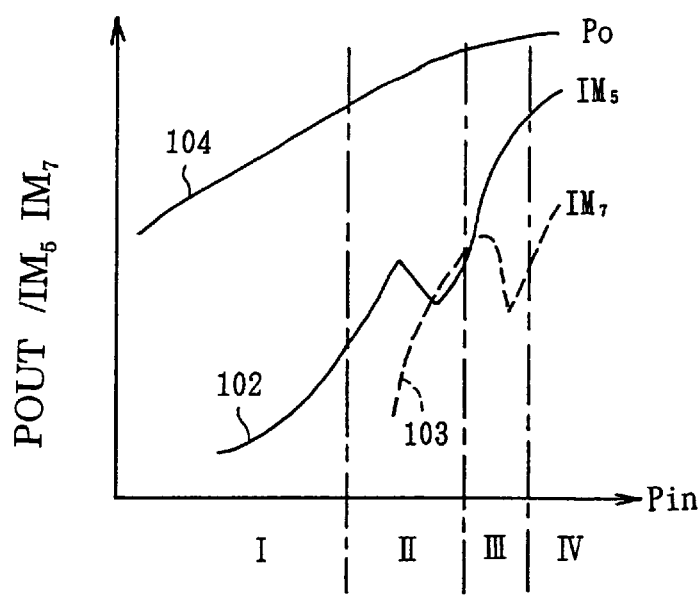
FIGS. 20A to 20E are graphs of characteristic curves illustrating examples of characteristics of $IM_5$ and $IM_7$ as well as $\pi/4$ shift QPSK modulation spectra.
Figure 20:
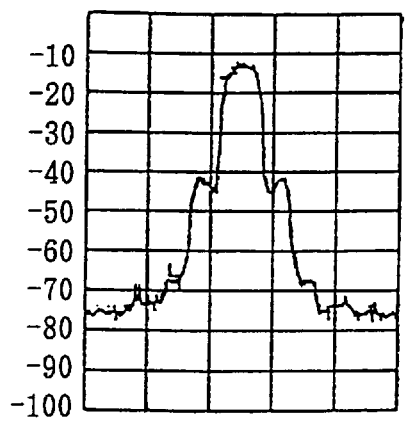
Figure 20:
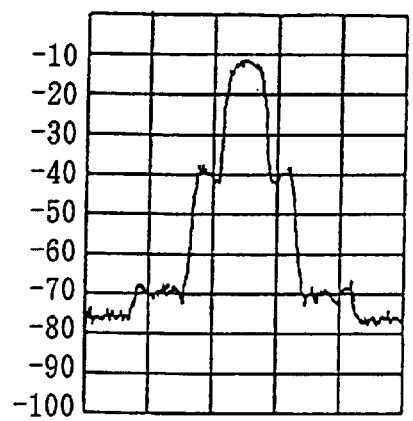
Figure 20:
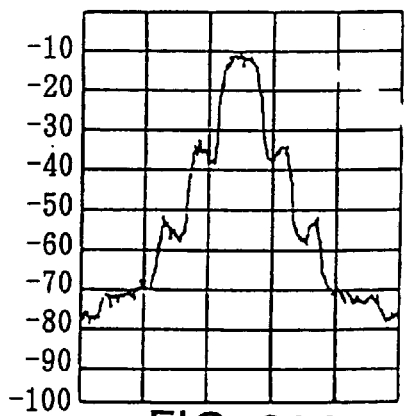
Figure 20:
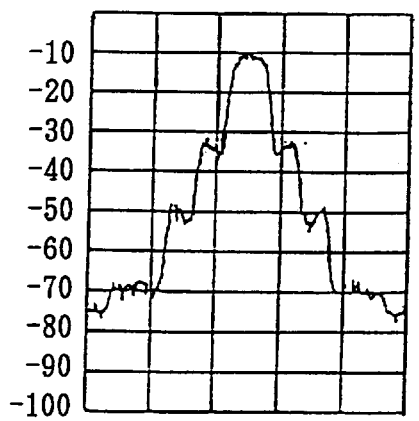

FIG. 20A illustrates the relationship between ACP and $IM_5$ and $IM_7$ when the impedance $Z_{es}$ is set at $Z_{es}$=30+j20. FIGS. 20B to 20E correspond to regions I to IV in FIG. 20A, respectively, illustrating how the modulation spectrum changes within and on both sides of an inflection section of ACP.

In the region I of FIG. 20A, $IM_5$ only is present. Thus, the fifth-order distortion only is seen without the seventh-order distortion, as illustrated in FIG. 20B.

In the region II of FIG. 20A, $IM_5$ decreases, while $IM_7$ increases. Thus, the fifth-order distortion is equal to the seventh-order distortion as illustrated in FIG. 20C.

In the region III of FIG. 20A, $IM_5$ increases, while $IM_7$ decreases. Thus, an increase in the fifth-order distortion and a decrease in the seventh-order distortion are present as illustrated in FIG. 20D.

In the region IV of FIG. 20A, $IM_5$ as well as $IM_7$ increase. Thus, the fifth-order distortion and the seventh-order distortion both increase as illustrated in FIG. 20E.

(1-2-7) Dependencies of ACP and IM on $Z_{es}$

Figure 21:
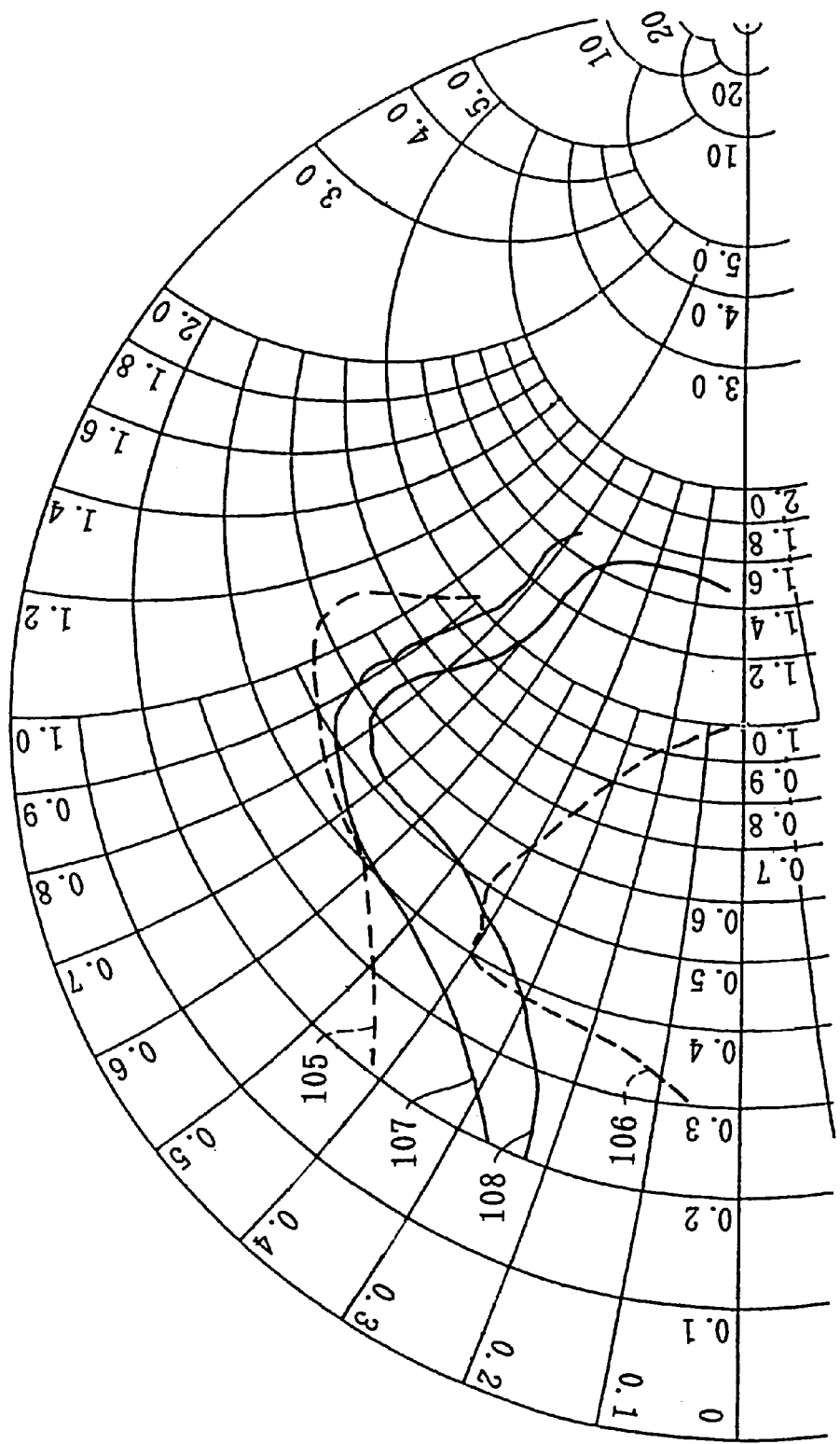
FIG. 21 is a characteristic curve chart illustrating measured values of ACP and $Z_{es}$ distribution of calculated $IM_5$ values.

Next, an examination is provided relating to the dependencies of ACP and $IM_5$ on the impedance $Z_{es}$. FIG. 21 illustrates characteristic curves 105, 106 based on measured values of ACP when the output power $P_0$ is equal to 22 dBm ($P_0$=22) and characteristic curves 107, 108 based on calculated values of $IM_5$. The characteristic curves 105 and 107 represent ACP and $IM_5$ at -55 dBc, respectively. The characteristic curves 106 and 108 represent ACP and $IM_5$ at -57 dBc, respectively.

When actual values of ACP are measured, a tuner is connected to each of the gate terminal and the drain terminal of the FET. Measured values of ACP are produced by using the tuner to vary the impedance $Z_{es}$ viewed from the gate side so as to maintain the output constant at 22 dBm. Calculated values are derived under the same conditions as the measurements.

It can be seen from FIG. 21 that the calculated values of $IM_5$ are substantially coincident with the measured values of ACP. Also, the measured values of ACP and the calculated values of $IM_5$ are both distributed substantially in the form of contour lines about the vicinity of $Z_{es}$=30+j10Ω. It can be thus also be anticipated from the above-mentioned results that distortion can be reduced by selecting the impedance $Z_{es}$ of the matching circuit viewed from the gate side. In this way, the results illustrated in FIG. 5 can be used for designing a power amplifier since the results can be theoretically explained.

(2) Operation of the Embodiment of the Invention

In the foregoing configuration, the impedances of the matching circuit 25, 26 in the transmission signal amplifier 9 in FIG. 2 are set in the following manner. Specifically, the impedance of the matching circuit 25 at the connection terminal P3, which is the impedance $Z_{es}$ viewed from the gate side, is set to an arbitrary value, at which $IM_5$ becomes minimal, using the results of FIG. 5. Thus, an inflection section is formed in the middle of a characteristic curve for $IM_5$.

The impedance of the matching circuit 26 at the connection point P5 is set at an impedance at which the output of the GaAs JFET 24 becomes maximal. This enables the transmission signal amplifier 9 to operate at a maximum efficiency.

Figure 22:
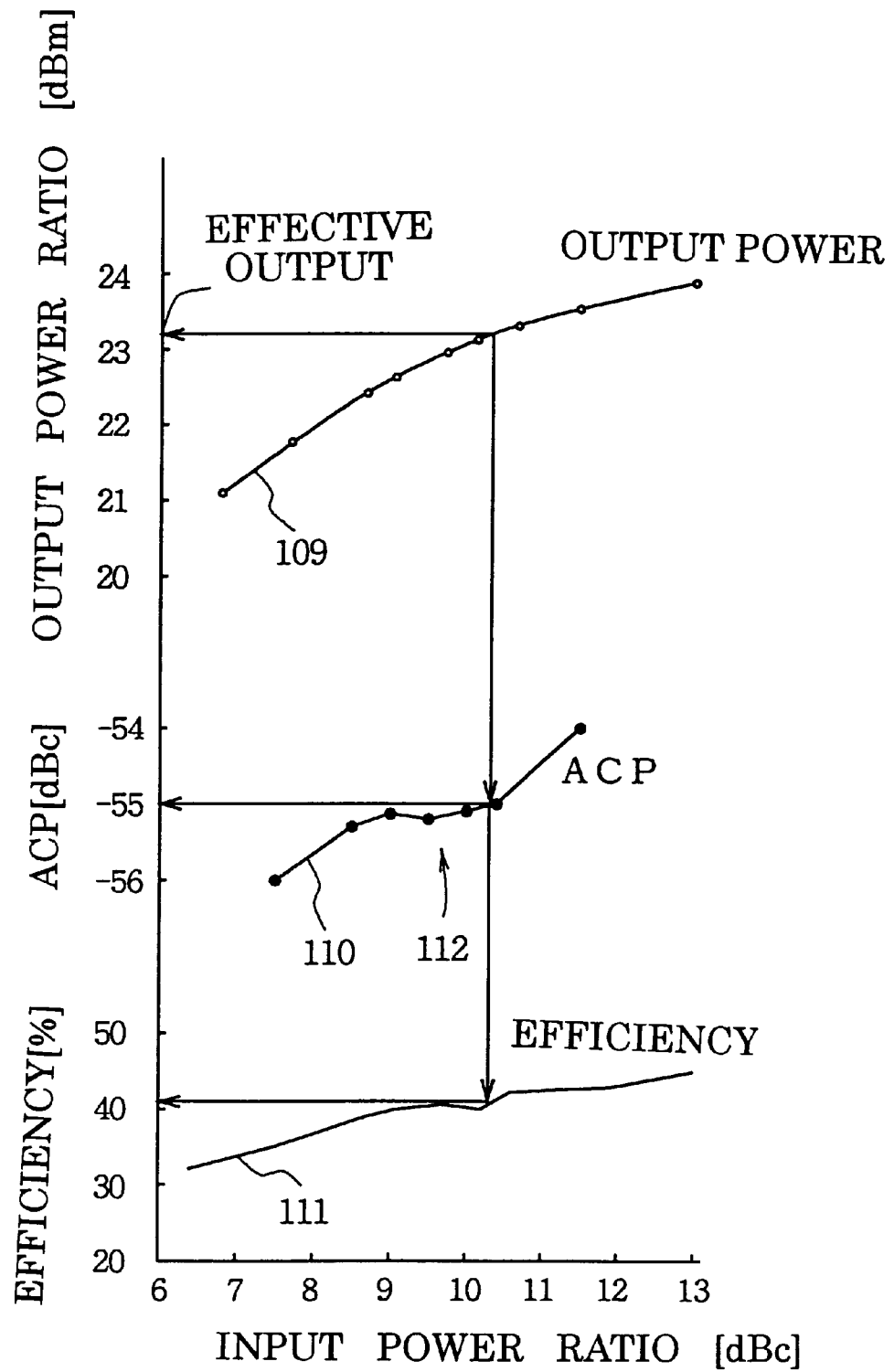
FIG. 22 is a graph of characteristic curves illustrating characteristics of output power, ACP, and efficiency of the transmission signal amplifier according to the embodiment of the invention.

FIG. 22 illustrates a characteristic curve 109 representing an output power ratio with respect to an input power ratio of the transmission signal amplifier 9 when the power of a π/4-shift-QPSK-modulated signal for the portable telephone 8 is amplified, a characteristic curve 110 for ACP, and a characteristic curve 111 for the efficiency. It can be seen that a inflection section 112 appears on the characteristic curve 110 for ACP at a position corresponding to an inflection section on the characteristic curve for $IM_5$. In other words, the effect of increasing the effective output by the formation of the inflection section 112 in the middle of the characteristic curve for $IM_5$ also appears in the π/4-shift-QPSK-modulated wave. In this way, the transmission signal amplifier 9 can increase the output power with the same ACP being maintained, since an increase in ACP is restricted by a portion corresponding to a shift of the second rising position of the characteristic curve 110 for ACP toward the right on the coordinate system in FIG. 22. The transmission signal amplifier 9 therefore satisfies the standard value (-55 dBc or less) for ACP, and can provide a much larger power addition efficiency of 41%, as compared with conventional amplifiers.

It should be noted that the impedance of the matching circuit 25 at the connection terminal P4 and the impedance of the matching circuit 26 at the connection terminal P6 are set, for example, at 50Ω, respectively.

(3) Advantage of an Embodiment of the Invention

According to the foregoing configuration, as the value of the impedance of the matching circuit 25 connected to the gate terminal of the GaAs JFET 24, viewed from the gate side, is set to a value which causes the formation of a inflection section in the middle of the characteristic curve for IM included in the output power of the GaAs JFET 24, the standard value for ACP is satisfied, and the power can be amplified at a much higher efficiency as compared with conventional amplifiers.

(4) Other Embodiments of the Invention

While the foregoing embodiment has been described for the case where the present invention is applied to the transmission signal amplifier 9 composed of the GaAs JFET 25 constituting one stage of amplification, the present invention is not limited to this particular configuration. The invention may also be applied to an amplifier comprising FETs at a plurality of stages. Similar effects to those in the foregoing embodiment can also be produced in this case.

Figure 23:
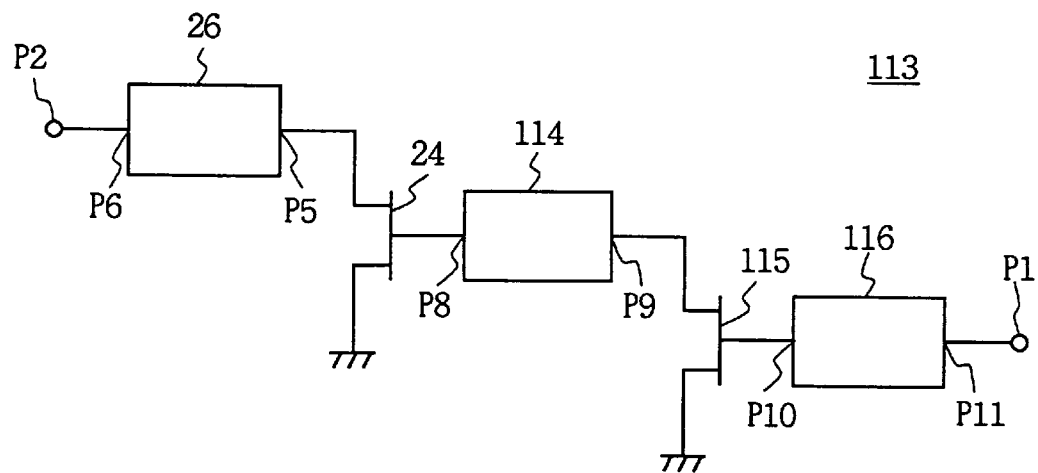
FIG. 23 is a block diagram illustrating a transmission signal amplifier having two stages of amplification according to another embodiment of the invention.
Figure 25:
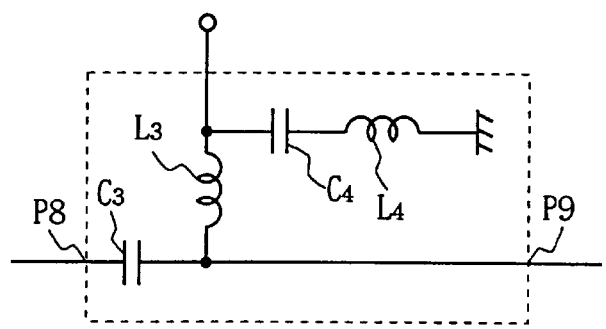
FIG. 25 is a connection diagram illustrating an example of a matching circuit.
Figure 26:
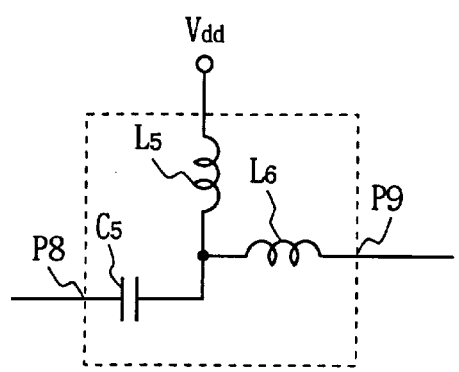
FIG. 26 is a connection diagram illustrating an example of another matching circuit.

For example, as illustrated in FIG. 23, a transmission signal amplifier 113, having two stages of amplification, is connected to a matching circuit 114 as an impedance circuit network, a GaAs JFET 115 as a transistor, and a matching circuit 116 as an impedance circuit network, in place of the matching circuit 25 connected to the transmission signal amplifier 9. One connection terminal P8 of the matching circuit 114 is connected to a gate terminal of a GaAs JFET 16. The other connection terminal P9 of the matching circuit 114 is connected to a drain terminal of the GaAs JFET 115. A gate terminal of the GaAs JFET 115 is connected to one connection terminal P10 of the matching circuit 116. The other connection terminal P11 of the matching circuit 116 is connected to an input terminal P1.

An impedance at the connection terminal P10 of the matching circuit 116 and an impedance at the connection terminal P9 of the matching circuit 114 are set at values which cause the GaAs JFET 115 to produce a maximum gain. An impedance at a connection terminal P5 of the matching circuit 26 is set at a value which causes a GaAs JFET 24 to produce a maximum output.

An impedance at a connection terminal P6 of the matching circuit 26 and an impedance at the connection terminal P11 of the matching circuit 116 are respectively set at 50Ω. An impedance at the connection terminal P8 of the matching circuit 114 is set at a value which allows IM included in output power of the GaAs JFET 24 to satisfy a standard value for ACP and present a minimum value, similarly to the transmission signal amplifier 9.

By thus setting the impedances, the transmission signal amplifier 113 can satisfy the standard value for ACP and amplify the power at a maximum power addition efficiency much higher than before.

Figure 24:
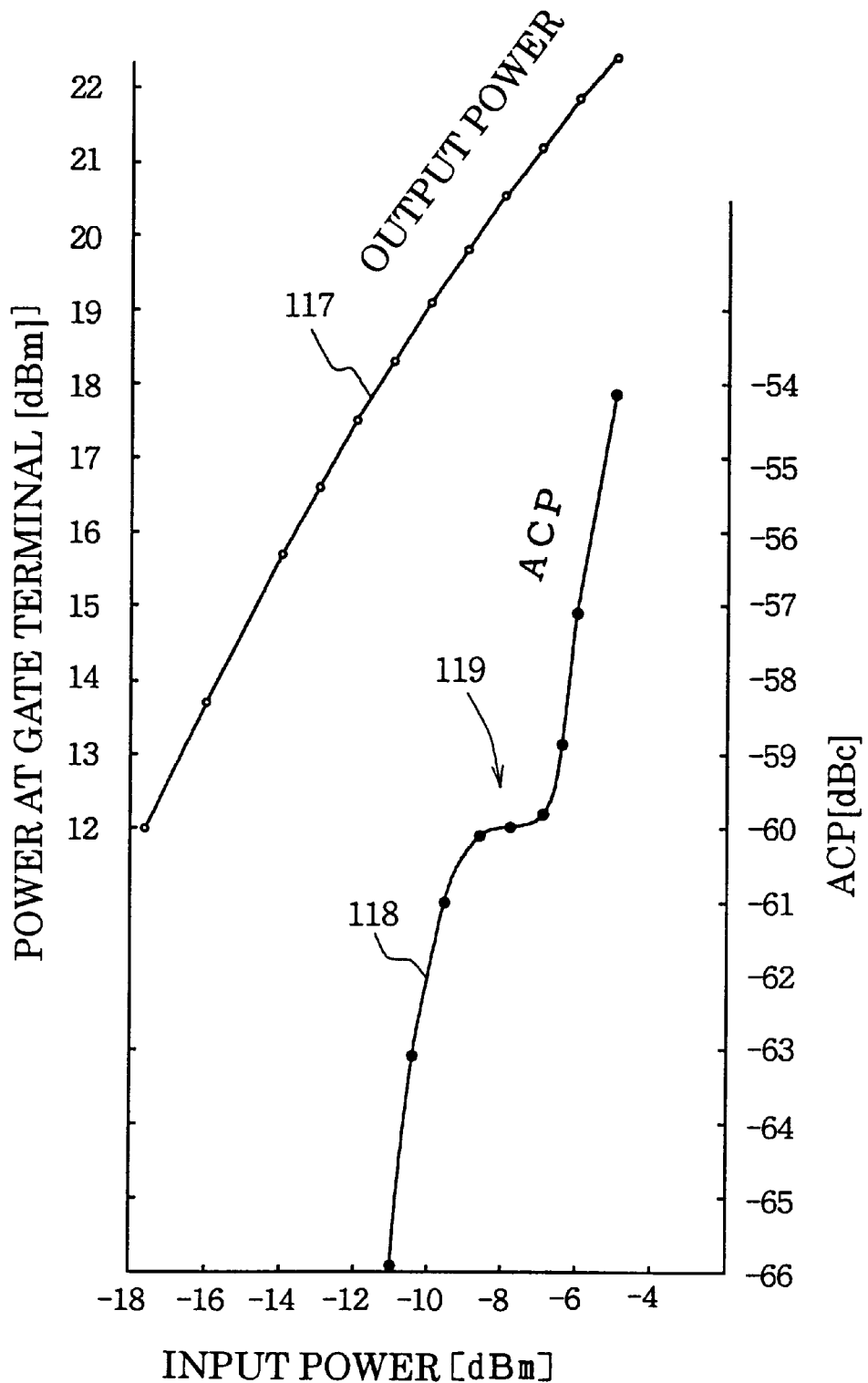
FIG. 24 is a graph of characteristic curves illustrating the characteristics of output power and ACP of the other embodiment of the invention.
Figure 27:
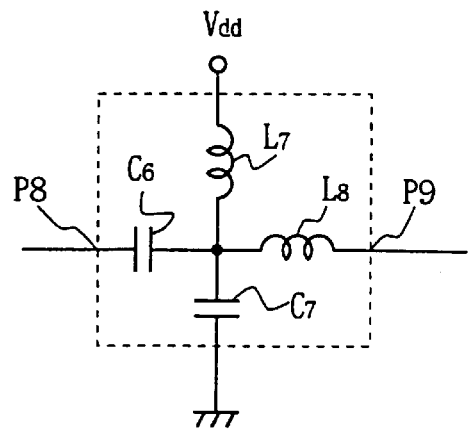
FIG. 27 is a connection diagram illustrating an example of still another matching circuit.
Figure 28:
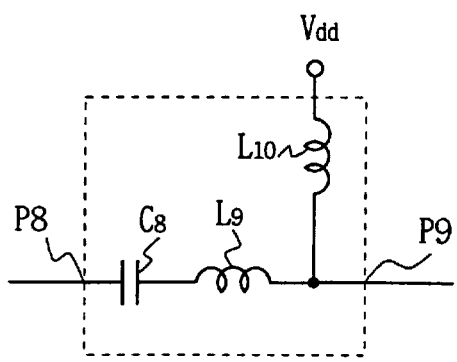
FIG. 28 is a connection diagram illustrating an example of a matching circuit.
Figure 29:
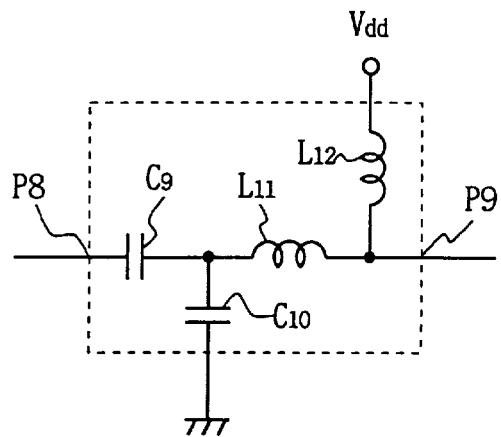
FIG. 29 is a connection diagram illustrating an example of a matching circuit.

FIG. 24 illustrates a characteristic curve 117 for output power and a characteristic curve 118 for ACP associated with the transmission signal amplifier 113, having impedances set as mentioned above, when a π/4-shift-QPSK-modulated wave is inputted thereto. The characteristic curves 117 and 118 are drawn on the assumption that the power is amplified in the portable telephone 8 of the PHS scheme. As illustrated in FIG. 24, the characteristic curve 118 for ACP of the transmission signal amplifier 113 having two stages of amplification also presents an inflection section 119 similarly to the characteristic curves 43 and 44 for $IM_5$ and $IM_7$ illustrated in FIG. 6.

Thus, the value of ACP is −55 dBc or less with the output equal to 22 dBm.

For reference, FIGS. 25 to 29 illustrate exemplary configurations of matching circuits 25 and 114.

While the foregoing embodiment has been described in connection with the formation of an inflection section on a characteristic curve for IM with respect to input power by varying the impedance $Z_{es}$ of the matching circuit 25 viewed from the gate side of the GaAs JFET 24, the present invention is not limited to this particular way, but can be applied to the formation of an inflection section on a characteristic curve for IM with respect to input power by varying an impedance of a matching circuit viewed from a drain side.

Specifically, in the transmission signal amplifier 9 of FIG. 2, the value of the impedance at the connection terminal PS of the matching circuit 26 viewed from the drain side of the GaAs JFET 24 is set at a value which causes the formation of a large inflection section in the middle of the characteristic curve for IM with respect to input power, such that the inflection section brings the effective output to a desired value. Similarly, the value of the impedance $Z_{es}$ at the connection terminal P3 of the matching circuit 25 viewed at the gate side of the GaAs JFET 24 is set at a value which causes IM of the GaAs JFET 24 to decrease to a minimum. In this way, the power addition efficiency of the transmission signal amplifier 9 can be further increased as compared with the foregoing embodiment. Further, in the transmission signal amplifier 113 of FIG. 23, the value of the impedance at the connection terminal P5 of the matching circuit 26 is set at a value which causes the formation of a large inflection section in the middle of the characteristic curve for IM with respect to input power, such that the inflection section brings the effective output to a desired value. Also, the impedance at the connection terminal P8 of the matching circuit 114 is set at a value which causes IM included in the output power of the GaAs JFET 24 to satisfy the standard value for ACP and become minimum.

In this way, it is possible to increase further the power addition efficiency of the transmission signal amplifier 113 having two stages of amplification in the other embodiment illustrated in FIG. 23.

Furthermore, while the foregoing embodiment has been described in connection with the transmission signal amplifier 9 and the portable telephone 8 using the same, to which the present invention is applied, the present invention is not limited to the application of such particular devices, but can be widely applied to semiconductor amplifying apparatuses using any arbitrary kind of FETs, for example, metal Shottky FET (MESFET), MOSFET (metal oxide semiconductor FET), and any arbitrary kind of bipolar transistors, for example, heterojunction bipolar transistor (HBT) for amplification, as well as to communication terminal apparatuses using such a semiconductor amplifier.

Also, while the foregoing embodiment has been described in connection with the portable telephone 8 of the PHS scheme to which the present invention is applied, the present invention is not limited to this particular scheme, but can be applied to communication terminal apparatuses of any arbitrary scheme, for example, a CDMA (Code Division Multiple Access) scheme and a NADC (North American Digital Cellular) scheme.

In addition, while in the foregoing embodiment, the matching circuits 25, 26, 114, and 116 have been composed of passive elements, the present invention is not limited to this particular configuration, but may also be applied to impedance circuit networks including active elements.

According to the present invention as described above, the value of an impedance viewed from an input side of an impedance circuit network connected to an input terminal of a transistor is set at a value which causes a characteristic curve for a mutual modulation distortion component included in output power of the transistor to include, in the middle thereof, a curve section in which an inclination angle of a tangential line to the characteristic curve once becomes smaller, or a curve section which downwardly protrudes. In this way, it is possible to realize a semiconductor amplifying apparatus and a communication terminal apparatus which can satisfy a standard value for the adjacent channel power and amplify the power at a much higher efficiency as compared with the prior art techniques.

What is claimed is:

1. A semiconductor amplifying apparatus comprising:
   a transistor having an input terminal and an output terminal; and
   an impedance matching circuit,
   wherein said impedance matching circuit is connected to at least one of said input terminal and said output terminal of said transistor for forming an inflection curve section in the middle of an operational characteristic curve representing a mutual modulation distortion component included in an output power of said transistor with respect to an input power due to an input signal applied to said transistor,
   said inflection curve section having a decreasing inclination angle of a tangential line to said operational characteristic curve as said input power increases.

2. The semiconductor amplifying apparatus according to claim 1 further comprising a plurality of transistors forming a plurality of amplifying stages wherein said impedance matching circuit is connected to at least one of the input terminal and the output terminal of each said transistors to amplify the power at each of said plurality of amplifying stages.

3. The semiconductor amplifying apparatus according to claim 1, characterized in that said transistor is a field effect transistor.

4. The semiconductor amplifying apparatus according to claim 3, characterized in that said field effect transistor is a junction field effect transistor.

5. The semiconductor amplifying apparatus according to claim 3, wherein said field effect transistor is a metal Shottky field effect transistor.

6. The semiconductor amplifying apparatus according to claim 4, wherein said junction field effect transistor is a gallium arsenate junction field effect transistor.

7. A communication terminal apparatus having a semiconductor amplifier unit in which an input signal is applied thereto for amplification so as to make communications through an output signal generated by amplifying the input signal by said semiconductor amplifier unit, said semiconductor amplifier unit comprising:
   a transistor having an input terminal and an output terminal; and
   an impedance matching circuit,
   wherein said impedance matching circuit is connected to at least one of said input terminal and said output terminal of said transistor for forming an inflection curve in the middle of an operational characteristic curve representing a mutual modulation distortion component included in an output power of said transistor with respect to an input power due to said input signal applied to said transistor,
   said inflection curve having a decreasing inclination angle of a tangential line to said operational characteristic curve as said input power increases.

8. A semiconductor amplifying apparatus comprising:
   a transistor comprising an input terminal and an output terminal; and
   means for forming an inflection curve section in the middle of an operational characteristic curve representing a mutual modulation distortion component included in an output power of said transistor with respect to an input power due to an input signal applied to said transistor,
   said inflection curve section having a decreasing inclination angle of a tangential line to said characteristic as said input power increases, and
   wherein said means for forming said inflection curve section is an impedance matching circuit connected at least to one of said input terminal and said output terminal of the transistor and provides impedance to the connected terminal.

9. The semiconductor amplifying apparatus according to claim 8 further comprising a plurality of transistors forming a plurality of amplifying stages wherein said means for forming said inflection curve section is connected to at least one of the input terminal and the output terminal of each said transistors to amplify the power at each of said plurality of amplifying stages.

10. The semiconductor amplifying apparatus according to claim 8, characterized in that said means for forming said inflection curve section is an impedance matching circuit connected to said transistor, wherein said transistor is a field effect transistor.

11. The semiconductor amplifying apparatus according to claim 10, characterized in that said field effect transistor is a junction field effect transistor.

12. The semiconductor amplifying apparatus according to claim 10, wherein said field effect transistor is a metal Shottky field effect transistor.

13. The semiconductor amplifying apparatus according to claim 11, wherein said junction field effect transistor is a gallium arsenate junction field effect transistor.

14. A communication terminal apparatus having a semiconductor amplifier unit in which an input signal is applied thereto for amplification so as to make communications through an output signal generated by amplifying the input signal by said semiconductor amplifier unit, said semiconductor amplifier unit comprising:
   a transistor comprising an input terminal and an output terminal; and
   means for forming an inflection curve in the middle of an operational characteristic curve representing a mutual modulation distortion component included in an output power of said transistor with respect to an input power due to an input signal applied to said transistor,
   said inflection curve having a decreasing inclination angle of a tangential line to said operational characteristic as said input power increases, and
   wherein said means for forming said inflection curve is an impedance matching circuit connected at least to one of said input terminal and said output terminal of the transistor and provides impedance to the connected terminal.

15. In a semiconductor amplifying apparatus, a method for amplifying channel power comprising the steps of:
   providing a transistor having an input terminal and an output terminal;
   providing an impedance matching circuit; and
   arranging said transistor, including said output and input terminals, and said impedance matching circuit to form an inflection curve section in the middle of an operational characteristic curve representing a mutual modulation distortion component included in an output power of said transistor with respect to an input power due to an input signal applied to said transistor,
   said inflection curve section having a decreasing inclination angle of a tangential line to said characteristic as said input power increases.

16. The method of claim 15, wherein said semiconductor amplifying apparatus further comprises a plurality of transistors forming a plurality of amplifying stages wherein said impedance circuit is connected to at least one of the input terminal and the output terminal of each said transistors to amplify the power at each of said plurality of amplifying stages.

17. The method of claim 15, wherein said transistor is a field effect transistor.

18. The method of claim 17, wherein said field effect transistor is a junction field effect transistor.

19. The method of claim 17, wherein said field effect transistor is a metal Shottky field effect transistor.

20. The method of claim 18, wherein said junction field effect transistor is a gallium arsenate junction field effect transistor.

21. In a communication terminal apparatus having a semiconductor amplifier unit in which an input signal is applied thereto so as to make communications through an output signal, a method for amplifying the input, comprising the steps of:

providing a transistor having an input terminal and an output terminal;

providing an impedance matching circuit; and arranging within said semiconductor amplifier unit said transistor, including said output and input terminals, and said impedance matching circuit to form an inflection curve section in the middle of an operational characteristic curve representing a mutual modulation distortion component included in an output power of said transistor with respect to an input power due to said input signal applied to said transistor, said curve section having a decreasing inclination angle of a tangential line to said characteristic as said input power increases.

22. The semiconductor amplifying apparatus according to claim 1, wherein said impedance matching circuit is comprised of an LC circuit.

23. The semiconductor amplifying apparatus according to claim 10, wherein said impedance matching circuit is comprised of an LC circuit.

24. The method of claim 15, wherein said impedance matching circuit is comprised of an LC circuit.

* * * * *